US012640218B2

(12) United States Patent
Booth et al.

(10) Patent No.: US 12,640,218 B2
(45) Date of Patent: May 26, 2026

(54) ERROR HANDLING FOR REPROJECTION TIMELINE

(71) Applicant: QUALCOMM Incorporated, San Diego, CA (US)

(72) Inventors: Simon Peter William Booth, San Diego, CA (US); Subbarao Palacharla, San Diego, CA (US); George Patsilaras, San Diego, CA (US); Hiral Nandu, South San Francisco, CA (US); Girish Bhat, San Diego, CA (US); Yen-Kuan Wu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 272 days.

(21) Appl. No.: 18/522,098

(22) Filed: Nov. 28, 2023

(65) Prior Publication Data

US 2024/0386980 A1 Nov. 21, 2024

Related U.S. Application Data

(60) Provisional application No. 63/503,451, filed on May 19, 2023.

(51) Int. Cl.
*G06F 12/00* (2006.01)
*G11C 29/12* (2006.01)

(52) U.S. Cl.
CPC ................ *G11C 29/12015* (2013.01); *G11C 2207/2245* (2013.01)

(58) Field of Classification Search
CPC ................ G11C 29/12015; G11C 2207/2245
See application file for complete search history.

(56) References Cited

U.S. PATENT DOCUMENTS 8,131,894 B2 * 3/2012 Cain, III ................ G06F 9/467
710/52
8,736,876 B2 * 5/2014 Hayakawa ............ G06F 3/1247
358/1.14

(Continued)

FOREIGN PATENT DOCUMENTS

CN 108921951 A 11/2018

OTHER PUBLICATIONS

International Search Report and Written Opinion—PCT/US2024/026248—ISA/EPO—Sep. 10, 2024.

*Primary Examiner* — Cheng Yuan Tseng
(74) *Attorney, Agent, or Firm* — Procopio, Cory, Hargreaves & Savitch LLP

(57) ABSTRACT

Aspects presented herein relate to methods and devices for data or graphics processing including an apparatus, e.g., a graphics processing unit (GPU). The apparatus may obtain an indication of a data write for data associated with data processing. The apparatus may write, based on the indication, the data associated with the data processing to a memory address. The apparatus may receive a read request for the data including the memory address, where the read request is associated with a read with invalidate process. The apparatus may retrieve, based on the read request, the data from at least one of a first cache or at least one second memory, where the retrieval of the data is based on a timing of the indication of the data write. The apparatus may output the retrieved data from at least one of the first cache or the at least one second memory.

26 Claims, 15 Drawing Sheets

(56)     References Cited

U.S. PATENT DOCUMENTS

|  |  |  |  |  |
|---|---|---|---|---|
| 9,696,929 | B2 * | 7/2017 | Muroyama | G06F 3/0689 |
| 10,067,767 | B2 * | 9/2018 | Lin | G06F 9/3858 |
| 10,198,286 | B2 * | 2/2019 | Landers | G06F 13/1605 |
| 10,223,115 | B2 * | 3/2019 | Han | G06F 15/76 |
| 10,432,297 | B2 * | 10/2019 | Lucky | H04B 7/2041 |
| 11,327,902 | B2 * | 5/2022 | Jung | G06F 12/0246 |
| 11,604,727 | B2 * | 3/2023 | Johannes de Jong | G06F 12/128 |
| 11,614,959 | B2 * | 3/2023 | Avni | G06F 12/0868 |
|  |  |  |  | 707/703 |
| 12,093,188 | B2 * | 9/2024 | Fang | G06F 12/0862 |
| 2010/0073388 | A1 | 3/2010 | Mostinski et al. |  |
| 2017/0301319 | A1 | 10/2017 | Croxford et al. |  |
| 2017/0357600 | A1 * | 12/2017 | Moon | G06F 12/0895 |
| 2018/0253868 | A1 | 9/2018 | Bratt et al. |  |
| 2022/0197812 | A1 | 6/2022 | Fruchter et al. |  |

* cited by examiner

Cache mapping 602

Main memory 620

Block 621
Block 622
Block 623
Block 624
Block 625
Block 626
Block 627
Block 628

...

Cache 610

Cache line 611
Cache line 612
Cache line 613
Cache line 614

...

600

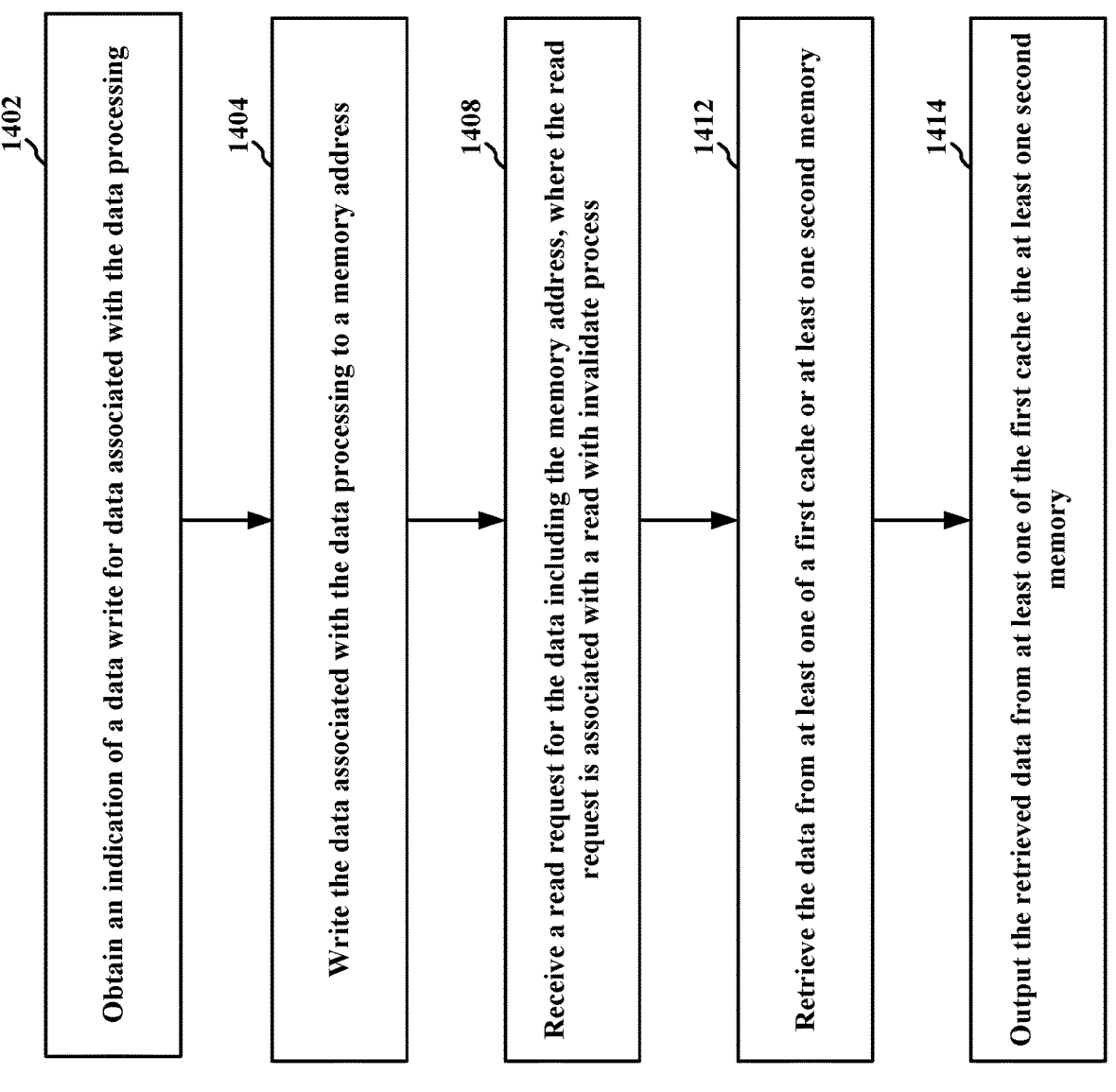

1402 Obtain an indication of a data write for data associated with the data processing 1404 Write the data associated with the data processing to a memory address 1408 Receive a read request for the data including the memory address, where the read request is associated with a read with invalidate process 1412 Retrieve the data from at least one of a first cache or at least one second memory 1414 Output the retrieved data from at least one of the first cache the at least one second memory

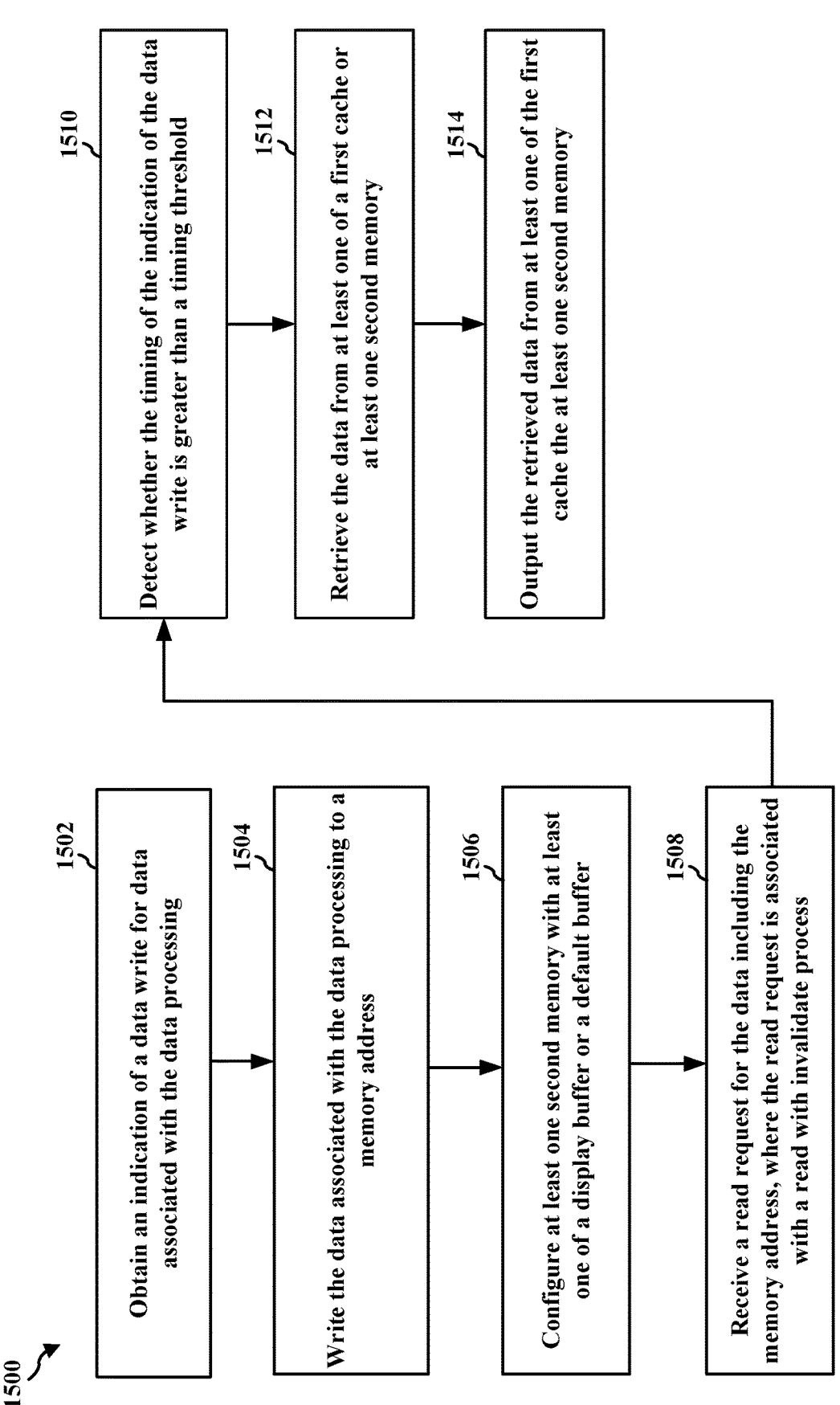

1500

1502
Obtain an indication of a data write for data associated with the data processing 1504
Write the data associated with the data processing to a memory address 1506
Configure at least one second memory with at least one of a display buffer or a default buffer 1508
Receive a read request for the data including the memory address, where the read request is associated with a read with invalidate process 1510
Detect whether the timing of the indication of the data write is greater than a timing threshold 1512
Retrieve the data from at least one of a first cache or at least one second memory 1514
Output the retrieved data from at least one of the first cache the at least one second memory

FIG. 15

ERROR HANDLING FOR REPROJECTION TIMELINE

CROSS REFERENCE TO RELATED APPLICATION(S)

This application claims the benefit of and priority to U.S. Provisional Application Ser. No. 63/503,451, entitled "ERROR HANDLING FOR REPROJECTION TIME-LINE" and filed on May 19, 2023, which is expressly incorporated by reference herein in its entirety.

TECHNICAL FIELD

The present disclosure relates generally to processing systems and, more particularly, to one or more techniques for data processing.

INTRODUCTION

Computing devices often perform graphics and/or display processing (e.g., utilizing a graphics processing unit (GPU), a central processing unit (CPU), a display processor, etc.) to render and display visual content. Such computing devices may include, for example, computer workstations, mobile phones such as smartphones, embedded systems, personal computers, tablet computers, and video game consoles. GPUs are configured to execute a graphics processing pipeline that includes one or more processing stages, which operate together to execute graphics processing commands and output a frame. A central processing unit (CPU) may control the operation of the GPU by issuing one or more graphics processing commands to the GPU. Modern day CPUs are typically capable of executing multiple applications concurrently, each of which may need to utilize the GPU during execution. A display processor is configured to convert digital information received from a CPU to analog values and may issue commands to a display panel for displaying the visual content. A device that provides content for visual presentation on a display may utilize a GPU and/or a display processor.

A GPU of a device may be configured to perform the processes in a graphics processing pipeline. Further, a display processor or display processing unit (DPU) may be configured to perform the processes of display processing. However, with the advent of wireless communication and smaller, handheld devices, there has developed an increased need for improved graphics or display processing.

BRIEF SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a graphics processing unit (GPU), a central processing unit (CPU), or any apparatus that may perform for data processing or graphics processing. The apparatus may obtain an indication of a data write for data associated with the data processing. The apparatus may also write, based on the indication, the data associated with the data processing to a memory address. Additionally, the apparatus may configure the at least one second memory with at least one of the display buffer or the default buffer. The apparatus may also receive a read request for the data including the memory address, where the read request is associated with a read with invalidate process. Moreover, the apparatus may detect whether the timing of the indication of the data write is greater than a timing threshold. The apparatus may also retrieve, based on the read request, the data from at least one of a first cache or at least one second memory, where the retrieval of the data is based on a timing of the indication of the data write. The apparatus may also output the retrieved data from at least one of the first cache or the at least one second memory.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIG. 14 is a flowchart of an example method of data processing.

FIG. 15 is a flowchart of an example method of data processing.

DETAILED DESCRIPTION

Figure 1:
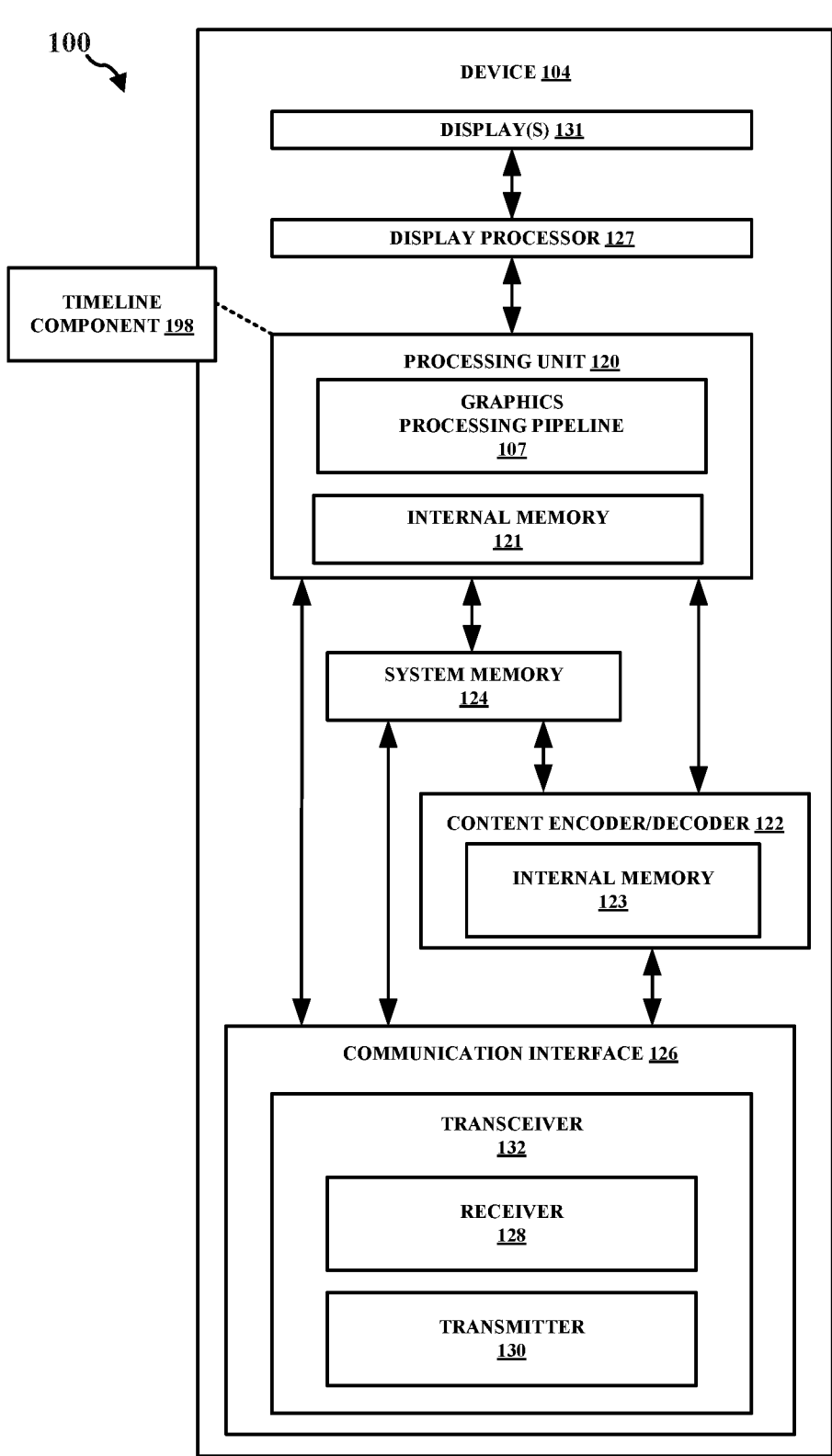
FIG. 1 is a block diagram that illustrates an example content generation system.

Reprojection processes may allow a headset or HMD (e.g., an AR or virtual reality (VR) headset) to be responsive to user motion, such as when a GPU cannot keep up with the target frame rate of the headset. Reprojection may involve a headset's driver taking one or more previously-rendered frames and using newer motion information from the headset's sensors to extrapolate the previous frame (i.e., referred to as "reprojecting" or "warping"). For instance, the previous frame may be extrapolated into a prediction of what a normally-rendered frame may look like. Reprojection may ideally allow the user to see AR content in real-time in a timely manner without any errors. Asynchronous reprojection may refer to this reprojection process being continuously performed in parallel with rendering, which may allow reprojected frames to be displayed without delay in case a regular frame is not rendered in time. However, in some aspects, the reprojection process may take a variable length of time. This variable length of time for reprojection may be based on a number of factors, such as delays in the availability of head poses. Further, the variable length of time for reprojection may be based on a variable amount of computation that may be needed for warp operation. Also, the variable length of time for reprojection may be based on a variation of memory access time for warp computation. In some instances, if the reprojection operation is delayed or slower than a desired timeline (i.e., longer than a suitable time threshold), the display engine may issue read transactions with incorrect data. For instance, if the reprojection operation is delayed, the display engine may issue read transactions where the data has not yet been written by the reprojection engine. The delayed reprojection operation may result in a number of erroneous operations, such as displaying incorrect or erroneous data (e.g., a previous frame). Moreover, a delayed reprojection operation may result in sending bandwidth information for a DRAM that exceeds certain capabilities. Also, a delayed reprojection operation may result in visual artifacts being displayed to the user. Aspects of the present disclosure may configure a data read or data retrieval process if a reprojection operation is delayed or slower than a desired timeline.

Aspects presented herein may include a number of benefits or advantages. For instance, if a reprojection operation takes longer than a suitable time threshold, aspects presented herein may modify a data read or data retrieval process in order to display correct or suitable data. Moreover, if a reprojection operation takes longer than a suitable time threshold, aspects presented herein may alter a data read or data retrieval process in order to send bandwidth information for a DRAM that is within certain capabilities. Additionally, if a reprojection operation takes longer than a suitable time threshold, aspects presented herein may modify a data read or data retrieval process in order to avoid displaying visual artifacts to a user (e.g., a user wearing a headset or HMD). Aspects presented herein may modify a data read or data retrieval process by reading or retrieving data from an alternate location. For example, if a reprojection operation takes longer than a suitable time threshold, aspects presented herein may read/retrieve the data from a dynamic random access memory (DRAM) rather than reading/retrieving the data from a system cache or a shared cache (e.g., a cache that is shared between a producer/GPU and a consumer/DPU). Also, aspects presented herein may reduce bandwidth (e.g., DDR bandwidth or DRAM bandwidth) and/or improve robustness of the system under heavy concurrency by leveraging error handing capabilities. Aspects presented herein may also be utilized in a reprojection engine (e.g., a reprojection engine at a GPU) for buffers handed to be displayed.

Various aspects of systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of this disclosure to those skilled in the art. Based on the teachings herein one skilled in the art should appreciate that the scope of this disclosure is intended to cover any aspect of the systems, apparatuses, computer program products, and methods disclosed herein, whether implemented independently of, or combined with, other aspects of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. Any aspect disclosed herein may be embodied by one or more elements of a claim.

Although various aspects are described herein, many variations and permutations of these aspects fall within the scope of this disclosure. Although some potential benefits and advantages of aspects of this disclosure are mentioned, the scope of this disclosure is not intended to be limited to particular benefits, uses, or objectives. Rather, aspects of this disclosure are intended to be broadly applicable to different wireless technologies, system configurations, networks, and transmission protocols, some of which are illustrated by way of example in the figures and in the following description. The detailed description and drawings are merely illustrative of this disclosure rather than limiting, the scope of this disclosure being defined by the appended claims and equivalents thereof.

Several aspects are presented with reference to various apparatus and methods. These apparatus and methods are described in the following detailed description and illustrated in the accompanying drawings by various blocks, components, circuits, processes, algorithms, and the like (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors (which may also be referred to as processing units). Examples of processors include microprocessors, microcontrollers, graphics processing units (GPUs), general purpose GPUs (GPGPUs), central processing units (CPUs), application processors, digital signal processors (DSPs), reduced instruction set computing (RISC) processors, systems-on-chip (SOC), baseband processors, application specific integrated circuits (ASICs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software may be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise. The term application may refer to software. As described herein, one or more techniques may refer to an application, i.e., software, being configured to perform one or more functions. In such examples, the application may be stored on a memory, e.g., on-chip memory of a processor, system memory, or any other memory. Hardware described herein, such as a processor may be configured to execute the application. For example, the application may be described as including code that, when executed by the hardware, causes the hardware to perform one or more techniques described herein. As an example, the hardware may access the code from a memory and execute the code accessed from the memory to perform one or more techniques described herein. In some examples, components are identified in this disclosure. In such examples, the components may be hardware, software, or a combination thereof. The components may be separate components or sub-components of a single component.

Accordingly, in one or more examples described herein, the functions described may be implemented in hardware, software, or any combination thereof. If implemented in software, the functions may be stored on or encoded as one or more instructions or code on a computer-readable medium. Computer-readable media includes computer storage media. Storage media may be any available media that may be accessed by a computer. By way of example, and not limitation, such computer-readable media may comprise a random access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that may be used to store computer executable code in the form of instructions or data structures that may be accessed by a computer.

In general, this disclosure describes techniques for having a graphics processing pipeline in a single device or multiple devices, improving the rendering of graphical content, and/ or reducing the load of a processing unit, i.e., any processing unit configured to perform one or more techniques described herein, such as a GPU. For example, this disclosure describes techniques for graphics processing in any device that utilizes graphics processing. Other example benefits are described throughout this disclosure.

As used herein, instances of the term "content" may refer to "graphical content," "image," and vice versa. This is true regardless of whether the terms are being used as an adjective, noun, or other parts of speech. In some examples, as used herein, the term "graphical content" may refer to a content produced by one or more processes of a graphics processing pipeline. In some examples, as used herein, the term "graphical content" may refer to a content produced by a processing unit configured to perform graphics processing. In some examples, as used herein, the term "graphical content" may refer to a content produced by a graphics processing unit.

In some examples, as used herein, the term "display content" may refer to content generated by a processing unit configured to perform displaying processing. In some examples, as used herein, the term "display content" may refer to content generated by a display processing unit. Graphical content may be processed to become display content. For example, a graphics processing unit may output graphical content, such as a frame, to a buffer (which may be referred to as a framebuffer). A display processing unit may read the graphical content, such as one or more frames from the buffer, and perform one or more display processing techniques thereon to generate display content. For example, a display processing unit may be configured to perform composition on one or more rendered layers to generate a frame. As another example, a display processing unit may be configured to compose, blend, or otherwise combine two or more layers together into a single frame. A display processing unit may be configured to perform scaling, e.g., upscaling or downscaling, on a frame. In some examples, a frame may refer to a layer. In other examples, a frame may refer to two or more layers that have already been blended together to form the frame, i.e., the frame includes two or more layers, and the frame that includes two or more layers may subsequently be blended.

FIG. 1 is a block diagram that illustrates an example content generation system 100 configured to implement one or more techniques of this disclosure. The content generation system 100 includes a device 104. The device 104 may include one or more components or circuits for performing various functions described herein. In some examples, one or more components of the device 104 may be components of an SOC. The device 104 may include one or more components configured to perform one or more techniques of this disclosure. In the example shown, the device 104 may include a processing unit 120, a content encoder/decoder 122, and a system memory 124. In some aspects, the device 104 may include a number of components, e.g., a communication interface 126, a transceiver 132, a receiver 128, a transmitter 130, a display processor 127, and one or more displays 131. Reference to the display 131 may refer to the one or more displays 131. For example, the display 131 may include a single display or multiple displays. The display 131 may include a first display and a second display. The first display may be a left-eye display and the second display may be a right-eye display. In some examples, the first and second display may receive different frames for presentment thereon. In other examples, the first and second display may receive the same frames for presentment thereon. In further examples, the results of the graphics processing may not be displayed on the device, e.g., the first and second display may not receive any frames for presentment thereon. Instead, the frames or graphics processing results may be transferred to another device. In some aspects, this may be referred to as split-rendering.

The processing unit 120 may include an internal memory 121. The processing unit 120 may be configured to perform graphics processing, such as in a graphics processing pipeline 107. The content encoder/decoder 122 may include an internal memory 123. In some examples, the device 104 may include a display processor, such as the display processor 127, to perform one or more display processing techniques on one or more frames generated by the processing unit 120 before presentment by the one or more displays 131. The display processor 127 may be configured to perform display processing. For example, the display processor 127 may be configured to perform one or more display processing techniques on one or more frames generated by the processing unit 120. The one or more displays 131 may be configured to display or otherwise present frames processed by the display processor 127. In some examples, the one or more displays 131 may include one or more of: a liquid crystal display (LCD), a plasma display, an organic light emitting diode (OLED) display, a projection display device, an augmented reality display device, a virtual reality display device, a head-mounted display, or any other type of display device.

Memory external to the processing unit 120 and the content encoder/decoder 122, such as system memory 124, may be accessible to the processing unit 120 and the content encoder/decoder 122. For example, the processing unit 120 and the content encoder/decoder 122 may be configured to read from and/or write to external memory, such as the system memory 124. The processing unit 120 and the content encoder/decoder 122 may be communicatively coupled to the system memory 124 over a bus. In some examples, the processing unit 120 and the content encoder/ decoder 122 may be communicatively coupled to each other over the bus or a different connection.

The content encoder/decoder 122 may be configured to receive graphical content from any source, such as the system memory 124 and/or the communication interface 126. The system memory 124 may be configured to store received encoded or decoded graphical content. The content encoder/decoder 122 may be configured to receive encoded or decoded graphical content, e.g., from the system memory 124 and/or the communication interface 126, in the form of encoded pixel data. The content encoder/decoder 122 may be configured to encode or decode any graphical content.

The internal memory 121 or the system memory 124 may include one or more volatile or non-volatile memories or storage devices. In some examples, internal memory 121 or the system memory 124 may include RAM, SRAM, DRAM, erasable programmable ROM (EPROM), electrically erasable programmable ROM (EEPROM), flash memory, a magnetic data media or an optical storage media, or any other type of memory.

The internal memory 121 or the system memory 124 may be a non-transitory storage medium according to some examples. The term "non-transitory" may indicate that the storage medium is not embodied in a carrier wave or a propagated signal. However, the term "non-transitory" should not be interpreted to mean that internal memory 121 or the system memory 124 is non-movable or that its contents are static. As one example, the system memory 124 may be removed from the device 104 and moved to another device. As another example, the system memory 124 may not be removable from the device 104.

The processing unit 120 may be a central processing unit (CPU), a graphics processing unit (GPU), a general purpose GPU (GPGPU), or any other processing unit that may be configured to perform graphics processing. In some examples, the processing unit 120 may be integrated into a motherboard of the device 104. In some examples, the processing unit 120 may be present on a graphics card that is installed in a port in a motherboard of the device 104, or may be otherwise incorporated within a peripheral device configured to interoperate with the device 104. The processing unit 120 may include one or more processors, such as one or more microprocessors, GPUs, application specific integrated circuits (ASICs), field programmable gate arrays (FPGAs), arithmetic logic units (ALUs), digital signal processors (DSPs), discrete logic, software, hardware, firmware, other equivalent integrated or discrete logic circuitry, or any combinations thereof. If the techniques are implemented partially in software, the processing unit 120 may store instructions for the software in a suitable, non-transitory computer-readable storage medium, e.g., internal memory 121, and may execute the instructions in hardware using one or more processors to perform the techniques of this disclosure. Any of the foregoing, including hardware, software, a combination of hardware and software, etc., may be considered to be one or more processors.

The content encoder/decoder 122 may be any processing unit configured to perform content decoding. In some examples, the content encoder/decoder 122 may be integrated into a motherboard of the device 104. The content encoder/decoder 122 may include one or more processors, such as one or more microprocessors, application specific integrated circuits (ASICs), field programmable gate arrays (FPGAs), arithmetic logic units (ALUs), digital signal processors (DSPs), video processors, discrete logic, software, hardware, firmware, other equivalent integrated or discrete logic circuitry, or any combinations thereof. If the techniques are implemented partially in software, the content encoder/decoder 122 may store instructions for the software in a suitable, non-transitory computer-readable storage medium, e.g., internal memory 123, and may execute the instructions in hardware using one or more processors to perform the techniques of this disclosure. Any of the foregoing, including hardware, software, a combination of hardware and software, etc., may be considered to be one or more processors.

In some aspects, the content generation system 100 may include a communication interface 126. The communication interface 126 may include a receiver 128 and a transmitter 130. The receiver 128 may be configured to perform any receiving function described herein with respect to the device 104. Additionally, the receiver 128 may be configured to receive information, e.g., eye or head position information, rendering commands, or location information, from another device. The transmitter 130 may be configured to perform any transmitting function described herein with respect to the device 104. For example, the transmitter 130 may be configured to transmit information to another device, which may include a request for content. The receiver 128 and the transmitter 130 may be combined into a transceiver 132. In such examples, the transceiver 132 may be configured to perform any receiving function and/or transmitting function described herein with respect to the device 104.

Referring again to FIG. 1, in certain aspects, the processing unit 120 may include a timeline component 198 configured to obtain an indication of a data write for data associated with the data processing. The timeline component 198 may also be configured to write, based on the indication, the data associated with the data processing to a memory address. The timeline component 198 may also be configured to configure the at least one second memory with at least one of the display buffer or the default buffer. The timeline component 198 may also be configured to receive a read request for the data including the memory address, where the read request is associated with a read with invalidate process. The timeline component 198 may also be configured to detect whether the timing of the indication of the data write is greater than a timing threshold. The timeline component 198 may also be configured to retrieve, based on the read request, the data from at least one of a first cache or at least one second memory, where the retrieval of the data is based on a timing of the indication of the data write. The timeline component 198 may also be configured to output the retrieved data from at least one of the first cache or the at least one second memory. Although the following description may be focused on display processing, the concepts described herein may be applicable to other similar processing techniques.

As described herein, a device, such as the device 104, may refer to any device, apparatus, or system configured to perform one or more techniques described herein. For example, a device may be a server, a base station, user equipment, a client device, a station, an access point, a computer, e.g., a personal computer, a desktop computer, a laptop computer, a tablet computer, a computer workstation, or a mainframe computer, an end product, an apparatus, a phone, a smart phone, a server, a video game platform or console, a handheld device, e.g., a portable video game device or a personal digital assistant (PDA), a wearable computing device, e.g., a smart watch, an augmented reality device, or a virtual reality device, a non-wearable device, a display or display device, a television, a television set-top box, an intermediate network device, a digital media player, a video streaming device, a content streaming device, an in-car computer, any mobile device, any device configured to generate graphical content, or any device configured to perform one or more techniques described herein. Processes herein may be described as performed by a particular component (e.g., a GPU), but, in further embodiments, may be performed using other components (e.g., a CPU), consistent with disclosed embodiments.

GPUs may process multiple types of data or data packets in a GPU pipeline. For instance, in some aspects, a GPU may process two types of data or data packets, e.g., context register packets and draw call data. A context register packet may be a set of global state information, e.g., information regarding a global register, shading program, or constant data, which may regulate how a graphics context will be processed. For example, context register packets may include information regarding a color format. In some aspects of context register packets, there may be a bit that indicates which workload belongs to a context register. Also, there may be multiple functions or programming running at the same time and/or in parallel. For example, functions or programming may describe a certain operation, e.g., the color mode or color format. Accordingly, a context register may define multiple states of a GPU.

Context states may be utilized to determine how an individual processing unit functions, e.g., a vertex fetcher (VFD), a vertex shader (VS), a shader processor, or a geometry processor, and/or in what mode the processing unit functions. In order to do so, GPUs may use context registers and programming data. In some aspects, a GPU may generate a workload, e.g., a vertex or pixel workload, in the pipeline based on the context register definition of a mode or state. Certain processing units, e.g., a VFD, may use these states to determine certain functions, e.g., how a vertex is assembled. As these modes or states may change, GPUs may need to change the corresponding context. Additionally, the workload that corresponds to the mode or state may follow the changing mode or state.

Figure 2:
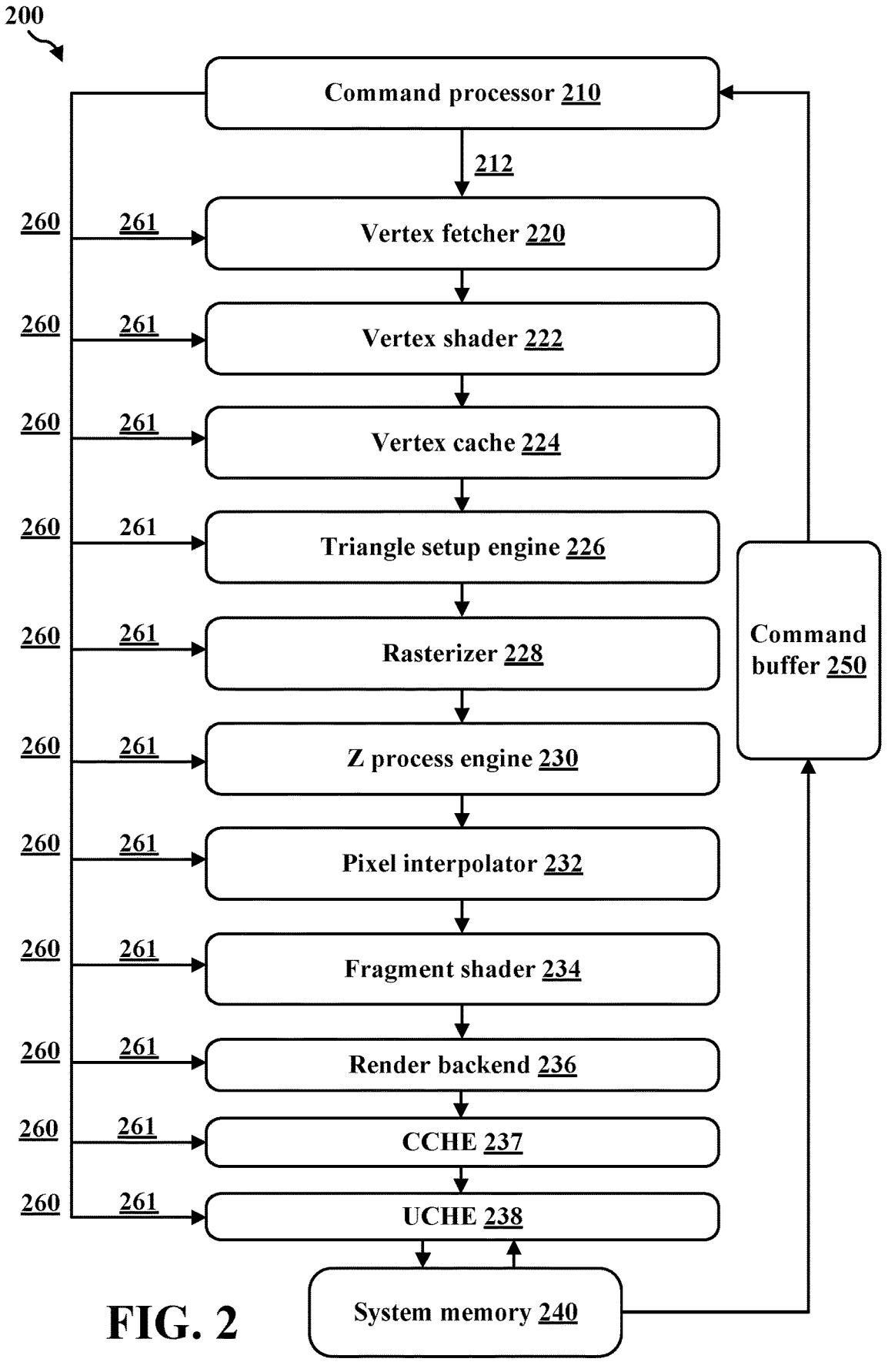
FIG. 2 illustrates an example graphics processing unit (GPU).

FIG. 2 illustrates an example GPU 200 in accordance with one or more techniques of this disclosure. As shown in FIG. 2, GPU 200 includes command processor (CP) 210, draw call packets 212, VFD 220, VS 222, vertex cache (VPC) 224, triangle setup engine (TSE) 226, rasterizer (RAS) 228, Z process engine (ZPE) 230, pixel interpolator (PI) 232, fragment shader (FS) 234, render backend (RB) 236, level 1 (L1) cache (cluster cache (CCHE)) 237, level 2 (L2) cache (UCHE) 238, and system memory 240. Although FIG. 2 displays that GPU 200 includes processing units 220-238, GPU 200 may include a number of additional processing units. Additionally, processing units 220-238 are merely an example and any combination or order of processing units may be used by GPUs according to the present disclosure. GPU 200 also includes command buffer 250, context register packets 260, and context states 261.

As shown in FIG. 2, a GPU may utilize a CP, e.g., CP 210, or hardware accelerator to parse a command buffer into context register packets, e.g., context register packets 260, and/or draw call data packets, e.g., draw call packets 212. The CP 210 may then send the context register packets 260 or draw call packets 212 through separate paths to the processing units or blocks in the GPU. Further, the command buffer 250 may alternate different states of context registers and draw calls. For example, a command buffer may be structured in the following manner: context register of context N, draw call(s) of context N, context register of context N+1, and draw call(s) of context N+1.

GPUs may render images in a variety of different ways. In some instances, GPUs may render an image using rendering and/or tiled rendering. In tiled rendering GPUs, an image may be divided or separated into different sections or tiles. After the division of the image, each section or tile may be rendered separately. Tiled rendering GPUs may divide computer graphics images into a grid format, such that each portion of the grid, i.e., a tile, is separately rendered. In some aspects, during a binning pass, an image may be divided into different bins or tiles. In some aspects, during the binning pass, a visibility stream may be constructed where visible primitives or draw calls may be identified. In contrast to tiled rendering, direct rendering does not divide the frame into smaller bins or tiles. Rather, in direct rendering, the entire frame is rendered at a single time. Additionally, some types of GPUs may allow for both tiled rendering and direct rendering.

Instructions executed by a CPU (e.g., software instructions) or a display processor may cause the CPU or the display processor to search for and/or generate a composition strategy for composing a frame based on a dynamic priority and runtime statistics associated with one or more composition strategy groups. A frame to be displayed by a physical display device, such as a display panel, may include a plurality of layers. Also, composition of the frame may be based on combining the plurality of layers into the frame (e.g., based on a frame buffer). After the plurality of layers are combined into the frame, the frame may be provided to the display panel for display thereon. The process of combining each of the plurality of layers into the frame may be referred to as composition, frame composition, a composition procedure, a composition process, or the like.

A frame composition procedure or composition strategy may correspond to a technique for composing different layers of the plurality of layers into a single frame. The plurality of layers may be stored in doubled data rate (DDR) memory. Each layer of the plurality of layers may further correspond to a separate buffer. A composer or hardware composer (HWC) associated with a block or function may determine an input of each layer/buffer and perform the frame composition procedure to generate an output indicative of a composed frame. That is, the input may be the layers and the output may be a frame composition procedure for composing the frame to be displayed on the display panel.

Some types of GPUs may include different types of pipelines, such as a graphics processing pipeline. Graphics processing pipelines may include one or more of a vertex shader stage, a hull shader stage, a domain shader stage, a geometry shader stage, and a pixel shader stage. These stages of the graphics processing pipeline may be considered shader stages. These shader stages may be implemented as one or more shader programs that execute on shader units at a GPU. Shader units may be configured as a programmable pipeline of processing components. In some examples, a shader unit may be referred to as "shader processors" or "unified shaders," and may perform geometry, vertex, pixel, or other shading operations to render graphics. Shader units may include shader processors, each of which may include one or more components for fetching and decoding operations, one or more arithmetic logic units (ALUs) for carrying out arithmetic calculations, one or more memories, caches, and registers.

Figure 3:
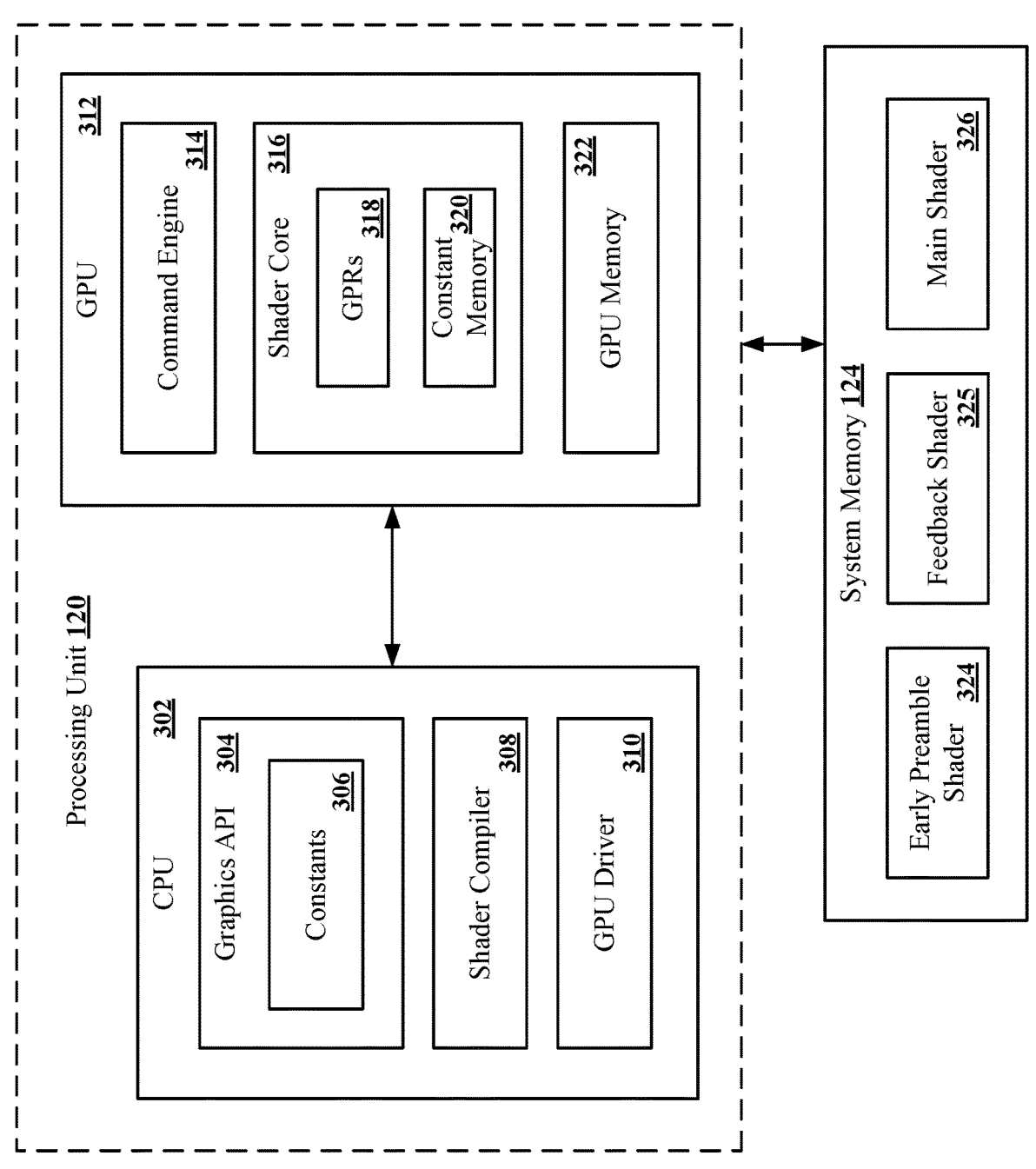
FIG. 3 is a diagram illustrating example processing components.

FIG. 3 is a diagram 300 that illustrates processing components, such as the processing unit 120 and the system memory 124, as may be identified in connection with the device 104 for processing data. In aspects, the processing unit 120 may include a CPU 302 and a GPU 312. The GPU 312 and the CPU 302 may be formed as an integrated circuit (e.g., a system-on-a-chip (SOC)) and/or the GPU 312 may be incorporated onto a motherboard with the CPU 302. Alternatively, the CPU 302 and the GPU 312 may be configured as distinct processing units that are communicatively coupled to each other. For example, the GPU 312 may be incorporated on a graphics card that is installed in a port of the motherboard that includes the CPU 302.

The CPU 302 may be configured to execute a software application that causes graphical content to be displayed (e.g., on the display(s) 131 of the device 104) based on one or more operations of the GPU 312. The software application may issue instructions to a graphics application program interface (API) 304, which may be a runtime program that translates instructions received from the software application into a format that is readable by a GPU driver 310. After receiving instructions from the software application via the graphics API 304, the GPU driver 310 may control an operation of the GPU 312 based on the instructions. For example, the GPU driver 310 may generate one or more command streams that are placed into the system memory 124, where the GPU 312 is instructed to execute the command streams (e.g., via one or more system calls). A command engine 314 included in the GPU 312 is configured to retrieve the one or more commands stored in the command streams. The command engine 314 may provide commands from the command stream for execution by the GPU 312. The command engine 314 may be hardware of the GPU 312, software/firmware executing on the GPU 312, or a combination thereof. While the GPU driver 310 is configured to implement the graphics API 304, the GPU driver 310 is not limited to being configured in accordance with any particular API. The system memory 124 may store the code for the GPU driver 310, which the CPU 302 may retrieve for execution. In examples, the GPU driver 310 may be configured to allow communication between the CPU 302 and the GPU 312, such as when the CPU 302 offloads graphics or non-graphics processing tasks to the GPU 312 via the GPU driver 310.

The system memory 124 may further store source code for one or more of an early preamble shader 324, a feedback shader 325, or a main shader 326. In such configurations, a shader compiler 308 executing on the CPU 302 may compile the source code of the shaders 324-326 to create object code or intermediate code executable by a shader core 316 of the GPU 312 during runtime (e.g., at the time when the shaders 324-326 are to be executed on the shader core 316). In some examples, the shader compiler 308 may pre-compile the shaders 324-326 and store the object code or intermediate code of the shader programs in the system memory 124. The shader compiler 308 (or in another example the GPU driver 310) executing on the CPU 302 may build a shader program with multiple components including the early preamble shader 324, the feedback shader 325, and the main shader 326. The main shader 326 may correspond to a portion or the entirety of the shader program that does not include the early preamble shader 324 or the feedback shader 325. The shader compiler 308 may receive instructions to compile the shader(s) 324-326 from a program executing on the CPU 302. The shader compiler 308 may also identify constant load instructions and common operations in the shader program for including the common operations within the early preamble shader 324 (rather than the main shader 326). The shader compiler 308 may identify such common instructions, for example, based on (presently undetermined) constants 306 to be included in the common instructions. The constants 306 may be defined within the graphics API 304 to be constant across an entire draw call. The shader compiler 308 may utilize instructions such as a preamble shader start to indicate a beginning of the early preamble shader 324 and a preamble shader end to indicate an end of the early preamble shader 324. Similar instructions may be used for the feedback shader 325 and the main shader 326. The feedback shader 325 will be described in further detail below.

The shader core 316 included in the GPU 312 may include general purpose registers (GPRs) 318 and constant memory 320. The GPRs 318 may correspond to a single GPR, a GPR file, and/or a GPR bank. Each GPR in the GPRs 318 may store data accessible to a single thread. The software and/or firmware executing on GPU 312 may be a shader program 324-326, which may execute on the shader core 316 of GPU 312. The shader core 316 may be configured to execute many instances of the same instructions of the same shader program in parallel. For example, the shader core 316 may execute the main shader 326 for each pixel that defines a given shape. The shader core 316 may transmit and receive data from applications executing on the CPU 302. In examples, constants 306 used for execution of the shaders 324-326 may be stored in a constant memory 320 (e.g., a read/write constant RAM) or the GPRs 318. The shader core 316 may load the constants 306 into the constant memory 320. In further examples, execution of the early preamble shader 324 or the feedback shader 325 may cause a constant value or a set of constant values to be stored in on-chip memory such as the constant memory 320 (e.g., constant RAM), the GPU memory 322, or the system memory 124. The constant memory 320 may include memory accessible by all aspects of the shader core 316 rather than just a particular portion reserved for a particular thread such as values held in the GPRs 318.

Figure 4:
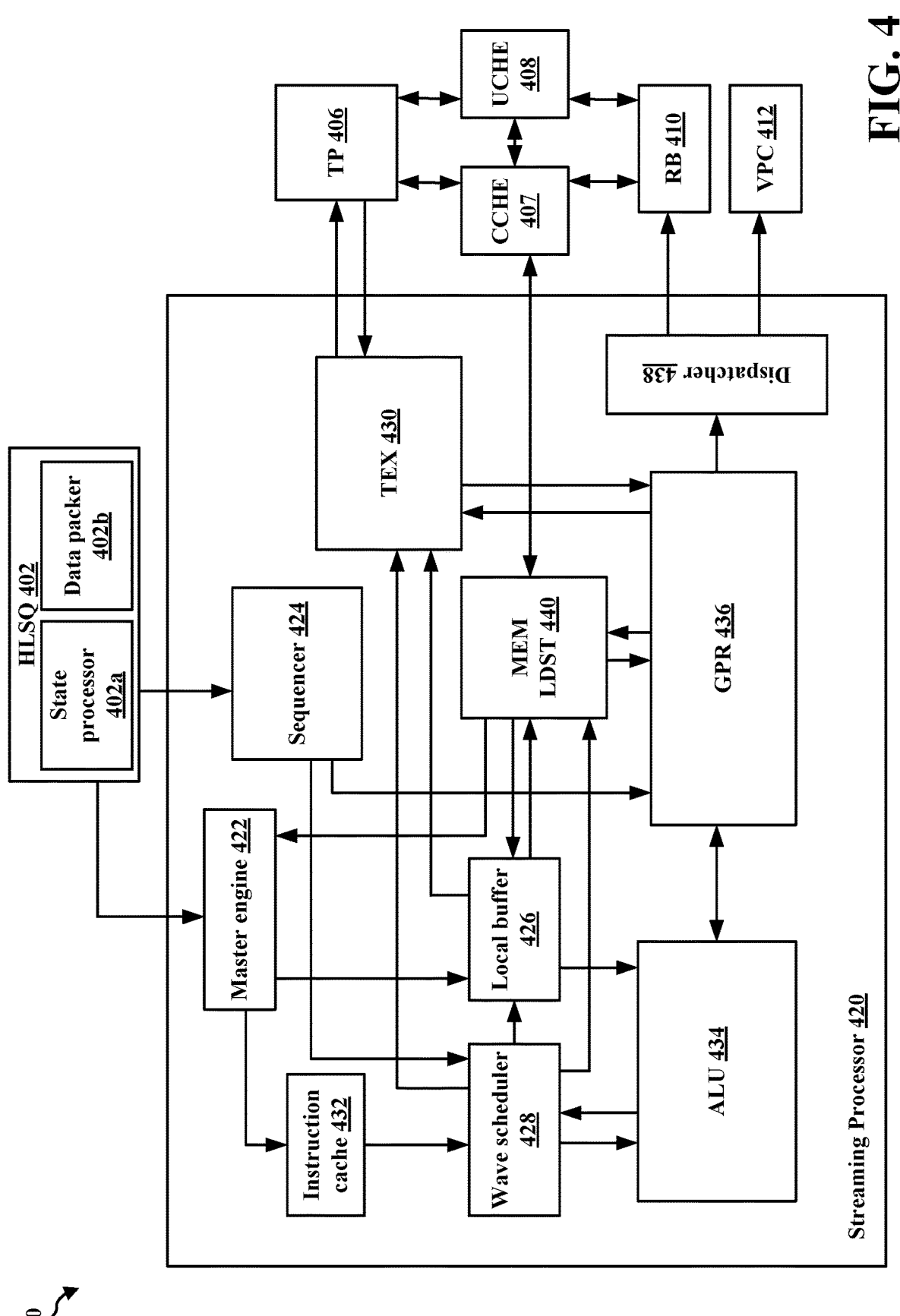
FIG. 4 is a diagram illustrating an example GPU.

FIG. 4 illustrates an example GPU 400. Specifically, FIG. 4 illustrates a streaming processor (SP) system in GPU 400. As shown in FIG. 4, GPU 400 includes a high level sequencer (HLSQ) 402, texture processor (TP) 406, level 1 (L1) cache (cluster cache (CCHE)) 407, level 2 (L2) cache (UCHE) 408, render backend (RB) 410, and vertex cache (VPC) 412. GPU 400 also includes SP 420, master engine 422, sequencer 424, local buffer 426, wave scheduler 428, texture (TEX) 430, instruction cache 432, arithmetic logic unit (ALU) 434, GPR 436, dispatcher 438, and memory (MEM) load store (LDST) 440.

As shown in FIG. 4, each unit or block in GPU 400 may send data or information to other blocks. For instance, HLSQ 402 may send commands to the master engine 422. Also, HLSQ 402 may send vertex threads, vertex attributes, pixel threads, pixel attributes, and/or compute commands to the sequencer 424. TP 406 may receive texture requests from TEX 430, and send texture elements (texels) back to the TEX 430. Further, TP 406 may send memory read requests to and receive memory data from CCHE 407 or UCHE 408. CCHE 407 or UCHE 408 may also receive memory read or write requests from MEM LDST 440 and send memory data back to MEM LDST 440, as well as receive memory read or write requests from RB 410 and send memory data back to RB 410. Also, RB 410 may receive an output in the form of color from GPR 436, e.g., via dispatcher 438. VPC 412 may also receive output in the form of vertices from GPR 436, e.g., via dispatcher 438. GPR 436 may send address data or receive write back data from MEM LDST 440. GPR 436 may also send temporary data to and receive temporary data from ALU 434. Moreover, ALU 434 may send address or predicate information to the wave scheduler 428, as well as receive instructions from wave scheduler 428. Local buffer 426 may send constant data to ALU 434. TEX 430 may also receive texture attributes from or send texture data to GPR 436, as well as receive constant data from local buffer 426. Further, TEX 430 may receive texture requests from wave scheduler 428, as well as receive constant data from local buffer 426. MEM LDST 440 may send/receive constant data to/from local buffer 426. Sequencer 424 may send wave data to wave scheduler 428, as well as send data to GPR 436. The sequencer 424 may allocate resources and local memory. Also, the sequencer 424 may allocate wave slots and any associated GPR 436 space. For example, the sequencer 424 may allocate wave slots or GPR 436 space when the HLSQ 402 issues a pixel tile workload to the SP 420. Master engine 422 may send program data to instruction cache 432, as well as send constant data to local buffer 426 and receive instructions from MEM LDST 440. Instruction cache 432 may send instructions or decode information to wave scheduler 428. Wave scheduler 428 may send read requests to local buffer 426, as well as send memory requests to MEM LDST 440.

As further shown in FIG. 4, the HLSQ 402 may prepare one or more context states for the SP 420. For example, the HLSQ 402 may prepare the context states for different types of data, e.g., global register data, shader constant data, buffer descriptors, instructions, etc. Additionally, the HLSQ 402 may embed context states into a command stream to the SP 420. The master engine 422 may parse the command stream from the HLSQ 402 and setup an SP global state. Moreover, the master engine 422 may fill or add to an instruction cache 432 and/or a local buffer 426 or a constant buffer. In some aspects, inside the HLSQ 402, there may be an internal function unit called a state processor 402a. The state processor 402a may be a single fiber scalar processor that may execute a special shader program, e.g., a preamble shader. The preamble shader may be generated by the GPU compiler in order to load constant data from different buffer objects. Also, the preamble shader may bind the buffer objects into a single constant buffer, such as a post-process constant buffer. Further, the HLSQ 402 may execute the preamble shader and, as a result, skip utilizing a main shader. In some instances, the main shader may perform different shading tasks, such as normal vertex shading and/or a fragment shading program. Moreover, the HLSQ 402 may include a data packer 402b.

Additionally, as shown in FIG. 4, the SP 420 may not be limited to executing a preamble if the HLSQ 402 decides to skip a preamble execution. For instance, the SP 420 may also process a conventional graphics workload, such as vertex shading and/or fragment shading. In some aspects, the SP 420 may utilize its execution units and storage in order to process compute tasks as a general purpose GPU (GPGPU). Inside the SP 420, there may be multiple parallel instruction execution units such as an ALU, elementary function unit (EFU), branching unit, TEX, general memory read and write (aka LDST), etc. The SP 420 may also include on-chip storage memory, such as a GPR 436 which may store per-fiber private data. Also, the SP 420 may include a local buffer 426 which stores per-shader or per-kernel constant data, per-wave uniform data (aka uGPR), and per-compute work group (WG) local memory (LM). Processing a preamble shader may take up one wave slot. Further, the majority of preamble shaders may use just the uGPR and not the GPR, and may execute ALU instructions on a scalar ALU. Therefore, execution of the preamble shader may be associated with high performance, and may be power efficient because any available wave slot may be used to execute the preamble shader even without GPR space allocation.

Moreover, as shown in FIG. 4, dispatcher 438 may fetch data from GPR 436. Dispatcher 438 may also perform format conversion, and then dispatch a final color to multiple render targets (RTs). Each RT may have one or more components, such as red (r) green (G) blue (B) alpha (A) (RGBA) data, or just an alpha component of the RGBA data. Further, each RT may be generally stored in a vector GPR, i.e., R3.0 may store red data, R3.1 may store green data, R3.2 may store blue data, etc. Also, a driver program in an SP context register may be utilized to define the GPR identifier (ID) which stores RT data.

Figure 5:
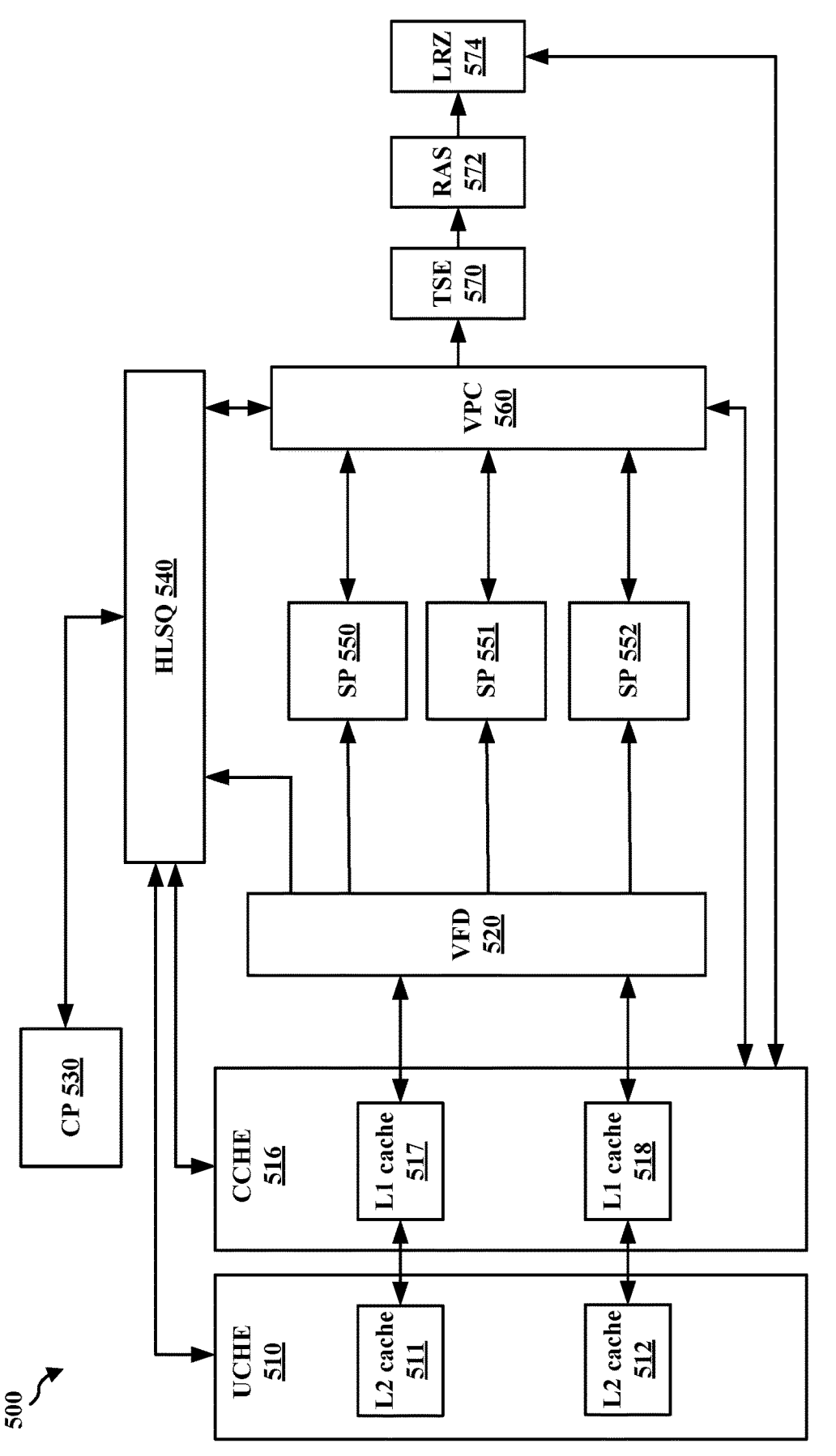
FIG. 5 is a diagram illustrating an example GPU.

FIG. 5 is a diagram illustrating another example GPU. More specifically, FIG. 5 depicts GPU 500 including a number of different components. As shown in FIG. 5, GPU 500 includes UCHE 510 including L2 cache 511 and L2 cache 512, CCHE 516 including L1 cache 517 and L1 cache 518, VFD 520, CP 530, HLSQ 540, a number of SPs (e.g., SP 550, SP 551, and SP 552), VPC 560, TSE 570, RAS 572, and low resolution Z (LRZ) component (e.g., LRZ 574). As shown in FIG. 5, CP 530 may transmit data to HLSQ 540 and receive data from HLSQ 540. CCHE 516 may transmit/receive data to/from HLSQ 540. UCHE 510 may also transmit/receive data to/from HLSQ 540. L2 cache 511 and L2 cache 512 may transmit/receive data to/from VFD 520. Further, VFD 520 may transmit data to HLSQ 540, as well as transmit data to SPs 550-552. Moreover, SPs 550-552 may transmit/receive data to/from VPC 560. Also, VPC 560 may transmit/receive data to/from HLSQ 540. Data can also be transmitted from VPC 560 to TSE 570, which can transmit data to RAS 572, and then to LRZ 574. CCHE 516 can transmit/receive data to/from VPC 560 and LRZ 574. Also, UCHE 510 can transmit/receive data to/from VPC 560 and LRZ 574.

As depicted in FIG. 5, GPUs (e.g., GPU 500) may include a number of different caches. GPUs utilize caches for a variety of reasons, such as to transfer data at a sufficiently high rate of speed. That is, as processing power for GPUs has increased at a higher rate than memory access speed, storage resources (e.g., caches) between the processor and memory have been utilized to transfer data at a sufficient rate. Caches at GPUs are also utilized to more seamlessly transfer data. One benefit of caches is that they provide buffering, so caches and buffers may be similar. For instance, caches may decrease latency by reading data from memory in larger chunks based on subsequent data accessing nearby address locations. Also, caches may increase throughput by assembling multiple small transfers into larger, more efficient memory requests. These benefits may be achieved by a cache storing data in blocks called cache lines. A cache line may be a portion of data that can be mapped into a cache. For example, a cache line may be a smallest portion of data that can be mapped into a cache.

In some aspects, each mapped cache line may be associated with a block (e.g., a core line), which is a corresponding region on a main memory or a backend storage). A backend storage may allow performance for the cache and GPU to improve. For example, database caching may allow an increased throughput and a reduced data retrieval latency associated with backend databases, which may improve the overall performance of the cache and GPU. Also, in some aspects, both the cache and main memory/backend storage may be divided into blocks of the size of a cache line. Further, all the cache mappings may be aligned to these blocks. Cache lines may have a certain size (e.g., between 32 to 512 bytes), and memory transactions may be performed in units of cache lines. Individual cache accesses made by code that executes on a GPU processor may be smaller than these units of cache lines (e.g., 4 bytes).

Figure 6:
FIG. 6 is a diagram illustrating an example mapping of a cache.

FIG. 6 is a diagram 600 illustrating an example mapping of a cache. More specifically, FIG. 6 depicts a cache mapping 602 for a cache 610 and a main memory 620. That is, FIG. 6 depicts the relationship between cache lines in cache 610 (e.g., cache line 611, cache line 612, cache line 613, and cache line 614) and blocks in main memory 620 (e.g., block 621, block 622, block 623, block 624, block 625, block 626, block 627, and block 628). As shown in FIG. 6, diagram 600 illustrates that individual blocks 621-628 may be directly mapped to individual cache lines 611-614. For example, as illustrated in diagram 600, block 621 may be mapped to cache line 611, block 622 may be mapped to cache line 613, block 625 may be mapped to cache line 612, and block 626 may be mapped to cache line 614. Some of the blocks 621-628 may not be directly mapped to cache lines 611-614. For instance, block 623, block 624, block 627, and block 628 may not be directly mapped to cache lines 611-614. In some aspects, main memory 620 including blocks 621-628 may be a backend storage including a number of core lines.

In some caches, valid data (e.g., valid bits) and dirty data (e.g., dirty bits) may correspond to a current cache line state. For instance, when a cache line is valid (i.e., in a valid state) it may refer to the cache line being mapped to a block in main memory (e.g., a core line determined by a core identifier (ID) and a core line number). When a cache line is invalid (i.e., in an invalid state), it may not map to any line in memory, and the cache line may become valid thereafter. A cache line may return to an invalid state based on a number of different reasons. For example, a cache line may return to an invalid state: if the cache line is being evicted (e.g., evicted due to cache maintenance operations, such as invalidate or clean and invalidate), if the core pointed to by the core ID is being removed, if the core pointed to by the core ID is being purged, if the entire cache is being purged, during a discard operation being performed on a corresponding core line, or during a certain request (e.g., an input/output (I/O) request) when a cache mode which may perform an invalidation is selected.

In some aspects, dirty data or modified data may refer to data that is associated with a block of memory and indicates whether the corresponding block of memory has been modified. For example, a dirty bit or modified bit may be a bit that is associated with a block of memory and indicates whether the corresponding block of memory has been modified. The dirty data (e.g., dirty bit) may be set when a processor writes to (i.e., modifies) this memory. For instance, the dirty data (e.g., dirty bit) may indicate that its associated block of memory has been modified and has not been saved to storage yet. That is, "dirty data" may refer to data in a cache that is modified, but the memory still has an old or stale copy of the data. In some instances, when a block of memory is to be replaced, its corresponding dirty data (e.g., dirty bit) may be checked to determine if the block may need to be written back to secondary memory before being replaced or if it can simply be removed. Moreover, dirty data (e.g., dirty bit) may determine if the cache line data stored in the cache is in synchronization with corresponding data on the backend storage. For instance, if a cache line is dirty, then data on the cache storage may be up to date, and the data may need to be flushed (i.e., removed) at some point in the future (e.g., after the flushing the data may be marked as clean by zeroing a dirty bit). Also, a cache line may be considered valid if at least one of its sectors is valid. Likewise, a cache line may be considered dirty if at least one of its sectors is dirty.

In some instances, a goal of caches (e.g., caches in GPUs or CPUs) may be to increase the performance of repeated accesses to the same data, as caches may keep a copy of a subset of the data in memory. Accordingly, subsequent accesses of the data already in the cache may not utilize an expensive memory access transaction. As some caches may have a smaller capacity than the memory size (e.g., a memory size of a GPU system), the currently-cached data set may continuously change. This continuously change in cached data may be due to the memory access pattern of the executed code and/or the data replacement policy of the cache. In some aspects, one goal of caches may be to maximize the cache hit rate (i.e., the percentage of data accesses that can be served from data in the cache). By maximizing the cache hit rate, the overall performance of the cache (e.g., cache at a GPU or CPU) may be increased. This performance improvement may be important for overall systems that include the cache (e.g., GPUs or CPUs), as the systems may serve numerous simultaneously running threads with data.

Caches may receive a number of requests (e.g., data or content requests) to store or cache data. A cache hit may refer to an event when data requested for processing (e.g., requested by a component or application) is successfully retrieved from the cache memory. For example, a cache hit may describe when data or content is successfully found in the cache. That is, a cache hit may be when a system or application makes a request to retrieve data from a cache, and the specific data is currently in cache memory. A cache miss may refer to an event when data requested for processing (e.g., requested by a component or application) is not successfully retrieved from the cache memory. For example, a cache miss may describe when data or content is not successfully found in the cache. That is, a cache miss may be when a system or application makes a request to retrieve data from a cache, but that specific data is not currently in cache memory. Caches may be measured based on an amount of data requests that the cache is able to successfully fill. A cache hit rate (i.e., hit rate or cache hit ratio) is a measurement of how many data requests a cache is able to successfully fill compared to a total number of data requests it receives. For instance, a cache hit rate (i.e., hit rate or cache hit ratio) is equal to the number of cache hits divided by the total number of data requests. As a formula, cache hit rate=(number of cache hits)/(number of cache hits+number of cache misses).

There are a number of different types of caches (e.g., caches that are utilized by GPUs or CPUs). For instance, there are fully-associative caches, direct-mapped caches, and set-associative cache. A fully-associative cache may utilize a least recently used (LRU) cache policy, where there are a number of cells (e.g., M cells) that are each capable of holding a cache line corresponding to any of the memory locations (e.g., N memory locations). In the case of cache contention, the cache line that is not accessed the longest may be kicked out and replaced with a new cache line. A direct-mapped cache may directly map a block of memory to a single cache line which it can occupy. A set-associative cache may divide the address space into equal groups, which separately act as small fully-associative caches.

A set indexing of a cache may refer to the size of the cache sets, or, i.e., how many different cache lines each data block can be mapped to. That is, the set indexing of a cache may refer to a number of cache lines that are associated with a cache set for the cache. Also, a set index (i.e., index) may be a portion of a cache address that identifies in which lines of the cache an address is found. A cache set may include the number of cache lines in the cache. An associativity of a cache may refer to the number of cache lines that are mapped to a set. That is, the associativity of a cache may refer to the number of multiple, different cache lines that are mapped to the same set. A higher associativity may result in a more efficient utilization of a cache, but may also increase the power/cost utilized by the cache. Likewise, a lower associativity may decrease the power/cost utilized by the cache, but may result in a less efficient utilization of the cache. The capacity of a cache may refer to the amount of data or information that can be stored in the cache. Additionally, the capacity or associativity of the cache may be adjusted based on a number of different factors (e.g., a cache hit rate). Further, a data allocation for a cache may be a manner in which data is allocated to a cache.

As caches may store and retrieve data from memory, in some instances, caches may experience memory latency. For instance, memory latency may be the time (i.e., latency) elapsed from an initial request for data until the data is actually retrieved. That is, memory latency may refer to time elapsed from an initiation of a request for a data (e.g., a byte or word) in memory until it is retrieved from the memory (e.g., retrieved from the memory by a processor). In comparison, memory latency measures a time elapsed to actually retrieve data from memory, while memory bandwidth measures a throughput of the memory. In some aspects, if the data is not in the memory or cache, it may take a longer period of time to obtain the data, thus resulting in an increased memory latency (e.g., the processor may have to communicate with external memory cells. For instance, memory latency may be a measure of the speed of the memory, such that a faster the reading operation will have a reduced memory latency and a slower the reading operation will have an increased memory latency. Memory latency may be expressed in different measurements of time (e.g., in actual time elapsed (such as ns) or clock cycles). Also, an average memory latency may refer to the average time elapsed from a request for data until the data is actually retrieved. The average memory latency may be calculated or determined based on an average of a number of data requests for a cache.

As mentioned herein, a cache may be utilized to store a variety of data or information (e.g., an address, some data, and some status information). A single cache may be used to store instructions and/or data (e.g., a unified cache). This type of cache may be referred to as an instruction cache (I-cache) and/or a data cache (D-cache). A "tag" may be a part of a memory address stored within a cache that identifies the main memory address associated with a line of data. For instance, the top bits of a memory address (e.g., a 64-bit address) may inform a cache where certain information came from in main memory (i.e., known as the tag). The total cache size may be a measure of the amount of data the cache can hold (e.g., random access memories (RAMs) used to hold tag values may not be included in the calculation). Additionally, the tag may take up physical space in the cache. In some aspects, it may be inefficient to store a small amount (e.g., one word) of data for each tag address, so several locations may be grouped together under the same tag. This type of logical block may be referred to as a cache line, which may refer to the smallest loadable unit of a cache (e.g., a block of contiguous words from main memory).

Additionally, a cache line may be valid when it contains cached data or instructions. Likewise, a cache line may be invalid when it does not contain cached data or instructions. Also, one or more status bits may be associated with each line of data. In some aspects, there may be a valid bit that marks the cache line as containing data that can be used. For instance, this may mean that the address tag represents some real value. In a data cache, there may be one or more dirty bits that denote whether the cache line (or part of the cache line) holds data that is not the same as (i.e., data that is newer than) the contents of main memory. Further, the data that is stored may correspond to a memory address (i.e., a location) in the cache. An "index" may be the portion of the memory address that identifies in which lines of the cache the address is found. For example, the index (e.g., the middle bits of the address) may identify the line. The index may also be used as an address for the cache RAMs and may not need storage as a part of the tag. A "way" may be a subdivision of a cache, where each way is an equal size and indexed in the same fashion. A "set" may include the cache lines from all of the ways that share a particular index. For instance, this may mean that the bottom few bits of the address (i.e., the offset) may not be stored in the tag. In some instance, the address of an entire line may be utilized (i.e., not each byte within the line).

Figure 7:
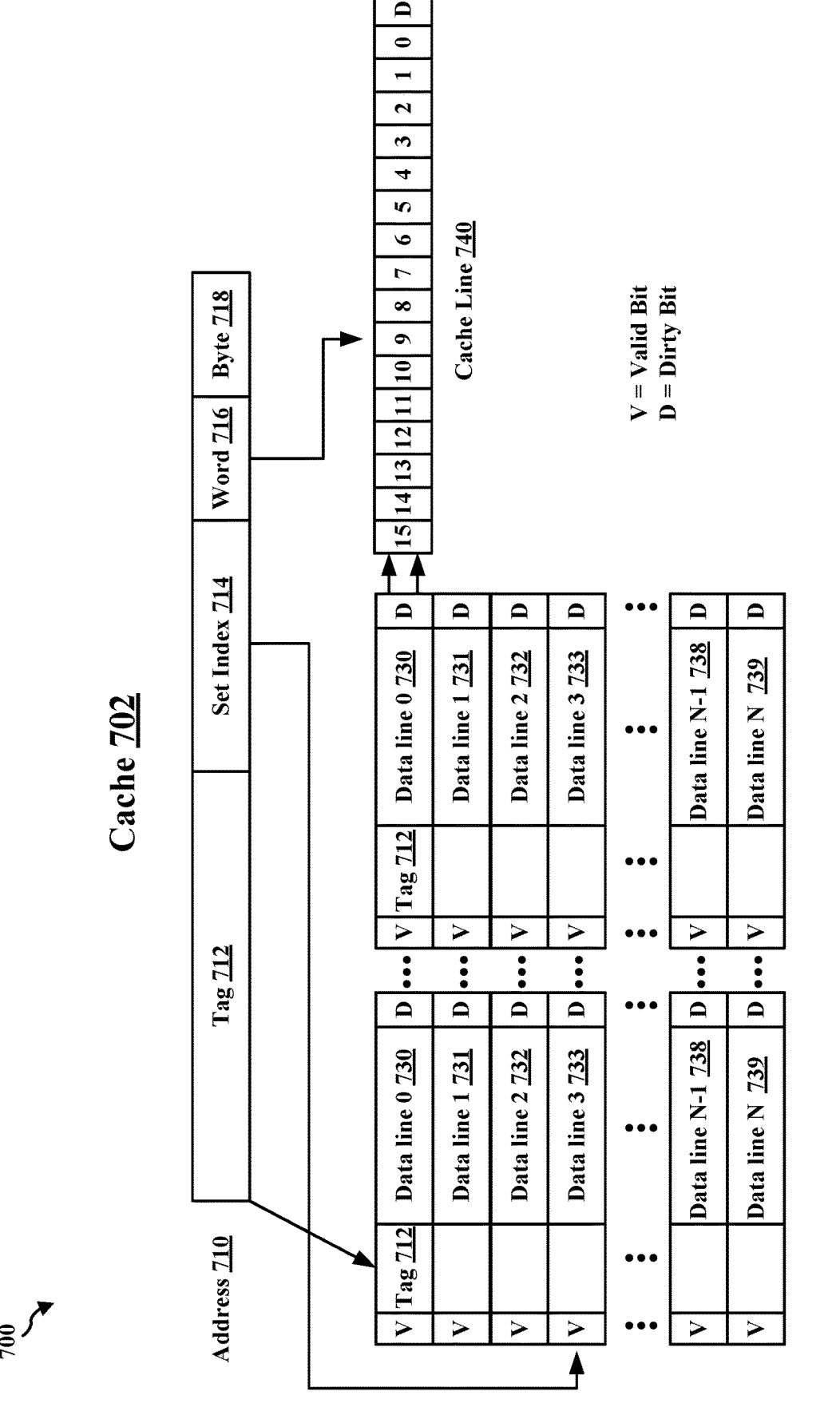
FIG. 7 is a diagram illustrating an example address location mapping for a cache.

FIG. 7 is a diagram 700 illustrating an example address location mapping for a cache. More specifically, FIG. 7 depicts an example storage system for a cache. As shown in FIG. 7, diagram 700 of cache 702 (e.g., a set associative data cache) depicts address 710 including tag 712, set index 714, word 716, byte 718, data line 730 (e.g., data line 0), data line 731 (e.g., data line 1), data line 732 (e.g., data line 2), data line 733 (e.g., data line 3), data line 738 (e.g., data line N–1 or a $254^{th}$ data line), data line 739 (e.g., data line N or a $255^{th}$ data line), and cache line 740. FIG. 7 depicts that tag 712 is a part of address 710 within cache 702 that identifies the main memory address associated with a line of data. Set index 714 (i.e., index) is the portion of address 710 that identifies in which lines of the cache 702 an address is found. For example, as FIG. 7 shows that there are N lines of data (e.g., 256 lines of data) in cache 702, set index 714 may identify in which lines (e.g., lines 0-256) a certain address is found. Set index 714 may map to all data lines 730-739. Diagram 700 also shows that word 716 corresponds to the cache line 740. Moreover, FIG. 7 shows valid bits (i.e., represented by "V" in FIG. 7) and dirty bits (i.e., represented by "D" in FIG. 7) in cache 702. As shown in FIG. 7, data line 738 (e.g., data line N–1) and data line 739 (e.g., data line N) depict that cache 702 may be an N-way associative cache.

Figure 8:
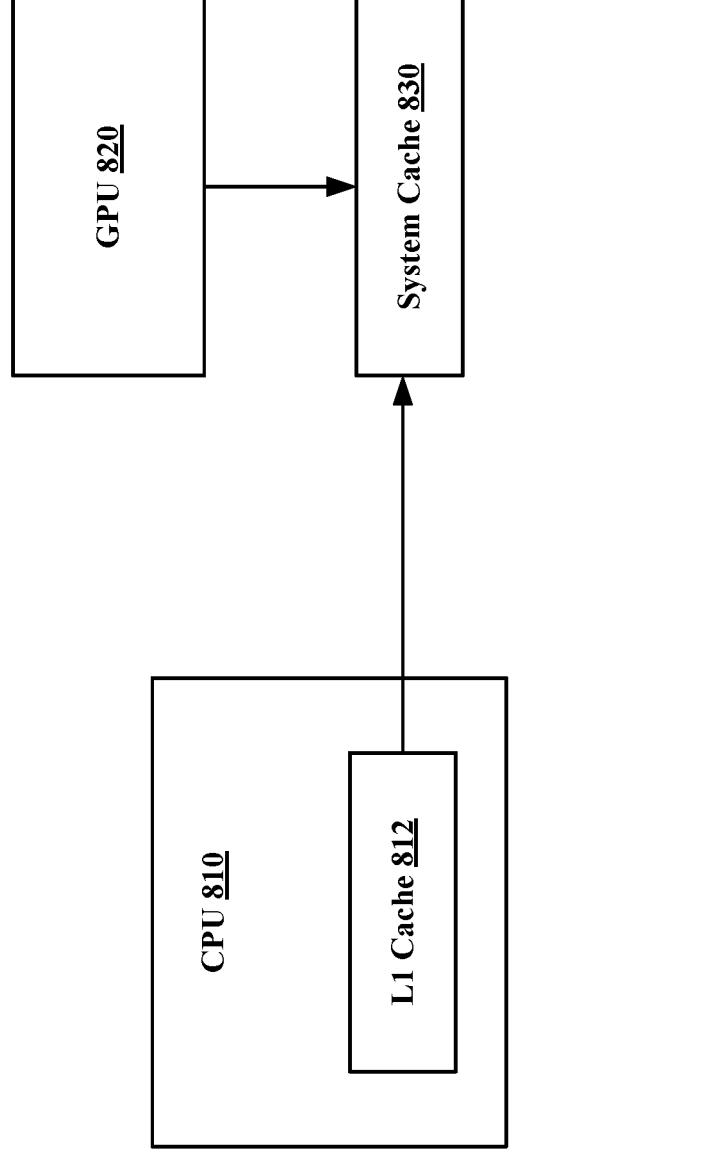
FIG. 8 is a diagram illustrating an example cache architecture.

FIG. 8 is a diagram 800 illustrating an example cache architecture. More specifically, FIG. 8 depicts an example architecture for a system cache and a layer 1 (L1) cache. As shown in FIG. 8, diagram 800 includes CPU 810 including L1 cache 812, GPU 820, and system cache 830. FIG. 8 depicts that CPU 810 may send information to system cache 830. For example, L1 cache 812 may send information to system cache 830. Also, GPU 820 may send information to system cache 830. As depicted in FIG. 8, the associativity for caches may be limited for a number of reasons. For instance, the associativity for caches may be limited for timing reasons and/or power reasons. For example, as shown in FIG. 8, the associativity of L1 cache 812 and/or system cache 830 may be limited due to the timing of information being transferred to/from CPU 810 and/or GPU 820. Additionally, as shown in FIG. 8, the associativity of L1 cache 812 and/or system cache 830 may be limited due to the power utilized by CPU 810 and/or GPU 820.

In some aspects, when performing a read operation on data (e.g., ephemeral data) stored in a cache, the ephemeral data may be tagged as no-writeback data so that the tagged ephemeral data may not be written into system memory. The no-writeback tag may be in addition to a conventional valid tag to indicate whether the corresponding data is valid or not. The no-writeback tagging may be accomplished in several ways, for example whereby the cache inspects the bus signaling associated with a read operation performed by a bus master. For example, the bus signaling may include a specialized version of a read instruction, where the opcode of the read instruction indicates that upon reading a cache line of data, the data is to be tagged as no-writeback. The cache may also inspect the master identification associated with the reading device (e.g., a display), and to tag the data as no-writeback depending upon the identification. Another method is to modify the transaction attribute in a transaction between a reading device and the cache to include a flag, where the flag may be set by the reading device to cause the cache upon performing the read operation to tag the cache line as no-writeback data.

Figure 9:
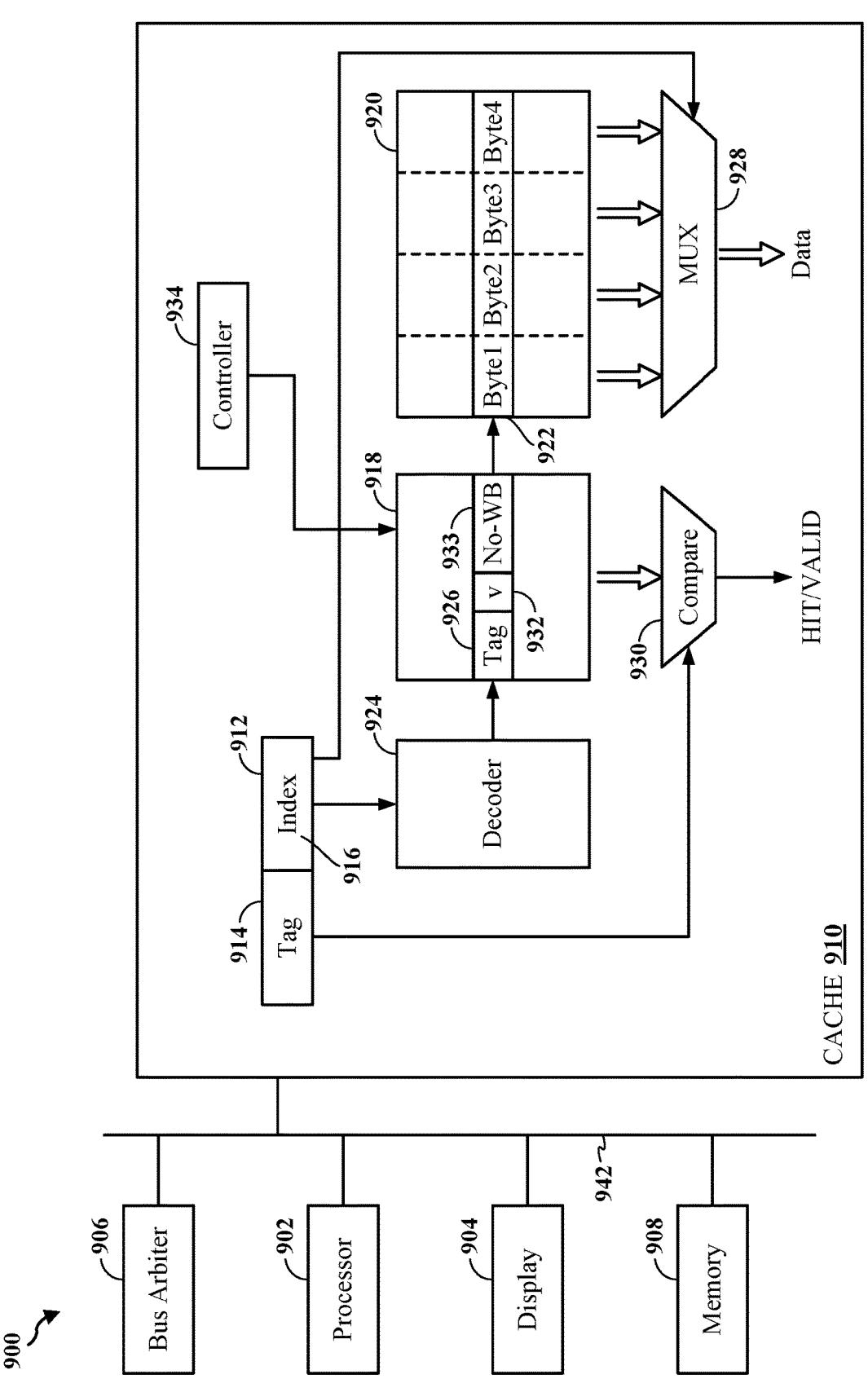
FIG. 9 is a diagram illustrating an example cache system.

FIG. 9 is a diagram 900 illustrating an example cache system. The diagram 900 comprises the processor 902 that may be used to process and manipulate images displayed on the display 904. Also included in the diagram 900 are the bus arbiter 906, the system memory 908, the cache 910, and the system bus 942. The diagram 900 may represent, for example, part of a larger system, such as a cellular phone or tablet.

For simplicity of illustration, not all components of a system are illustrated in FIG. 9. Some of the components illustrated in the diagram 900 may be integrated on one or more semiconductor chips. For example, the cache 910 may be integrated with the processor 902, but for simplicity it is shown as a separate component coupled to the system bus 942. As another example, the processor 902 may perform the function of the bus arbiter 906. Furthermore, the system memory 908 may be part of a memory hierarchy, and there may be several levels of cache. For simplicity, one level of cache, the cache 910, is shown. For example, cache 910 may be a level 1 (L1) cache.

The processor 902 may be dedicated to the display 904 and optimized for image processing. However, embodiments may not be so limited, and the processor 902 may represent a general application processor for a cellular phone or tablet, for example. For some embodiments, all or most of the components illustrated in FIG. 9 may be dedicated to the display 904, or optimized for image processing. For example, the cache 910 may be integrated with the processor 902 and dedicated to the display 904, where the system memory 908 is shared with other components not shown.

The cache 910 may include a register 912 for holding a cache address. In the particular example of FIG. 9, a cache address stored in the register 912 may include two fields, a tag field 914 and an index field 916, where the value in the tag field 914 is an upper set of bits of the cache address and the value in the index field 916 is a lower set of bits of the cache address. For the particular example of FIG. 9, the cache 910 may be organized as a direct-mapped cache with the tags stored in the random access memory (RAM) (e.g., RAM 918) and corresponding cache lines of data stored in the RAM 920. In some aspects, controller 934 may communicate with RAM 918. For other embodiments, a cache may be organized in other ways, such as for example as a set-associative cache. It may be immaterial to the discussion whether the RAM 918 and the RAM 920 are implemented as separate RAMs or one RAM. Other types of storage to store the cache lines and associated bits may be used. For the particular example of FIG. 9, each cache line, such as the cache line 922, includes four bytes of data.

An upper set of bits in the index field 916 may be provided to the decoder 924, which may be used to index into the RAM 918 to obtain the tag 926 associated with the cache line 922. A lower set of bits in the index field 916 may be used with the multiplexer 928 to select a particular byte stored in the cache line 922. The tag 926 may be compared with the value stored in the tag field 914 by the comparator 930 to indicate if there is a match. In addition to the tag 926, the upper set of bits stored in the index field 916 may be used to index into the RAM 918 to provide a valid bit 932 associated with the cache line 922, where the valid bit 932 indicates whether the data stored in the cache line 922 is valid. If the tag 926 matches the value of the tag field 914, and if the valid bit 932 indicates that the cache line 922 is valid, then there may be a valid hit indicating that the data stored in the cache line 922 has the correct address and is valid.

In addition to providing the valid bit 932, the upper set of bits stored in the index field 916 indexes into the RAM 918 to provide a no-writeback bit 933 associated with the cache line 922. The no-writeback bit 933 may indicate whether the data stored in the cache line 922 should be written back to the system memory 908 upon eviction of the cache line 922 from the cache 910. If the no-writeback bit 933 has been set, then regardless of the cache policy in place, the cache line 922 may not be written back to the system memory 908.

In some aspects, the instruction set for the processor 902 may include a read-no-writeback instruction. A read-no-writeback instruction may be an instruction for which one of its parameters is an address, and when it is received by the cache 910, the data associated with that address may be read from the appropriate cache line as in a conventional read operation. Provided the appropriate cache line is found, the no-writeback bit associated with the cache line may be set to indicate that the cache line is not to be written back to the system memory 908 when evicted from the cache. With the no-writeback bit set in this way, data in the cache line may not be written into system memory (or a higher level of cache). If after receiving a read-no-writeback instruction a cache coherence policy sends a write-back instruction to the cache 910, cache lines marked as no-writeback may not be written into memory (e.g., the system memory 908). Here, reference to the cache 910 receiving an instruction may mean that various bus signals are provided to the cache 910 indicative of the instruction.

Additionally, in some aspects, the no-writeback bit may be used as a means to select the next-to-be replaced cache line. For instance, the replacement policy may be to search those cache lines having a set no-writeback bit, and to evict such cache lines before evicting valid cache lines for which their no-writeback bit has not been set. This may be based on the premise that the data (e.g., ephemeral data) has seen its last use and can be replaced. This process may be referred to as a "read with invalidate" process, as the cache lines are read and then evicted (i.e., invalidated). A "read with invalidate" process may refer to a read transaction which, when it hits in the cache (i.e., finds the data), it returns the data but also invalidates the data (e.g., sets the valid bit to a value of 0), so the replacement policy can replace it next with a new line.

In aspects of augmented reality (AR) systems and system-on-chips (SoCs), it may be important to save power, as headsets or head-mounted devices (HMDs) that display AR content may have a limited amount of power to utilize. Accordingly, in AR systems and SoCs, data may be communicated between applications, such as via a producer and a consumer. For example, in order to save power in AR systems and SoCs, data shared in a producer-consumer relationship may be allocated into a cache. Further, data shared in a producer-consumer relationship may be allocated into certain types of memory (e.g., system random access memory (SRAM)), rather than allocated into other types of memory (e.g., dynamic random access memory DRAM)). One example of this process may be a reprojection engine (e.g., a reprojection engine at a GPU), which may perform a warp of rendered frames based on a head-pose. This warp of rendered frames may, in turn, be read by another processor (e.g., the display processor). In order to optimize user experience, the reprojection process may be timed to start as close as possible to when it is utilized by the display. For example, there may be a tight time deadline from when this process begins to when the pixels are displayed. As such, this path may need to be optimized in terms of latency and/or power efficiency. One implementation of this process may be to use a cache where the producer (e.g., a reprojection engine at a GPU) allocates, and the consumer (display processor) issues, a read instruction. For instance, the read/write instruction may hit in the cache, thereby avoiding DRAM access. That is, the cache may help to speed up this process and reduce the latency, but also help to save power, rather than having to access the DRAM.

Figure 10:
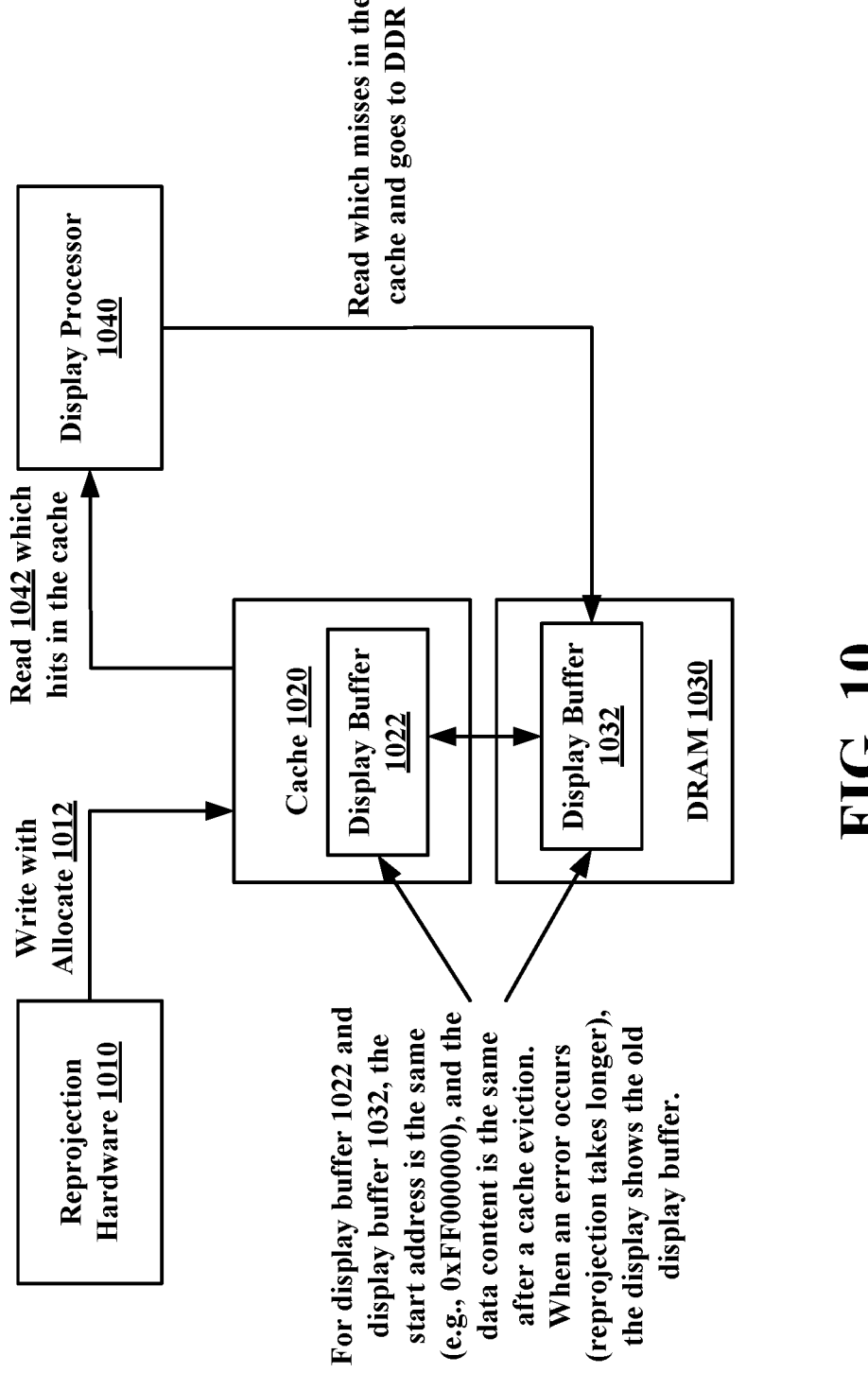
FIG. 10 is a diagram illustrating an example data retrieval process in a cache system.

FIG. 10 is a diagram 1000 illustrating an example data retrieval process in a cache system. More specifically, FIG. 10 depicts an example producer (e.g., a reprojection engine at a GPU) and consumer (display processor) retrieving data from a cache. As shown in FIG. 10, diagram 1000 includes reprojection hardware 1010 (e.g., reprojection hardware at a GPU), a write with allocate instruction 1012, a cache 1020 including a display buffer 1022 (e.g., a default buffer), a DRAM 1030 including display buffer 1032 (e.g., a default buffer), a display processor 1040, and a read instruction 1042 (which hits in the cache). FIG. 10 depicts that reprojection hardware 1010 may send a write with allocate instruction 1012 to cache 1020. Display processor 1040 may also send a read instruction 1042, which hits in the cache, and returns the data to the display processor 1040. As shown in FIG. 10, the write with allocate instruction 1012 and read instruction 1042 may hit in the cache 1020, thereby avoiding access at the DRAM 1030. By doing allowing these instructions to hit in the cache 1020, in some aspects, this may reduce latency and save power. As shown in FIG. 10, there may be multiple instances of a display buffer (e.g., display buffer 1022 and display buffer 1032). For display buffer 1022 and display buffer 1032, the start address may be the same (e.g., 0xFF000000), and the data content may be the same after a cache eviction. When an error occurs (reprojection takes longer), the display shows the old display buffer.

Reprojection processes may allow a headset or HMD (e.g., an AR or virtual reality (VR) headset) to be responsive to user motion, such as when a GPU cannot keep up with the target frame rate of the headset. Reprojection may involve a headset's driver taking one or more previously-rendered frames and using newer motion information from the headset's sensors to extrapolate the previous frame (i.e., referred to as "reprojecting" or "warping"). For instance, the previous frame may be extrapolated into a prediction of what a normally-rendered frame may look like. Reprojection may ideally allow the user to see AR content in real-time in a timely manner without any errors. Asynchronous reprojection may refer to this reprojection process being continuously performed in parallel with rendering, which may allow reprojected frames to be displayed without delay in case a regular frame is not rendered in time. However, in some aspects, the reprojection process may take a variable length of time. This variable length of time for reprojection may be based on a number of factors, such as delays in the availability of head poses. Further, the variable length of time for reprojection may be based on a variable amount of computation that may be needed for warp operation. Also, the variable length of time for reprojection may be based on a variation of memory access time for warp computation.

In some instances, if the reprojection operation is delayed or slower than a desired timeline (i.e., longer than a suitable time threshold), the display engine may issue a read transaction, which would return incorrect data. For instance, if the reprojection operation is delayed, the display engine may issue read transactions where the data has not yet been written by the reprojection engine. The delayed reprojection operation may result in a number of erroneous operations, such as displaying incorrect or erroneous data (e.g., a previous frame). Moreover, a delayed reprojection operation may result in sending bandwidth information for a DRAM that exceeds certain capabilities. Also, a delayed reprojection operation may result in visual artifacts being displayed to the user. Based on the above, it may be beneficial to configure a data read or retrieval process in the event that a reprojection operation is delayed or slower than a desired timeline.

Aspects of the present disclosure may configure a data read or data retrieval process if a reprojection operation is delayed or slower than a desired timeline. For instance, if a reprojection operation takes longer than a suitable time threshold, aspects presented herein may configure a data read or data retrieval process in order to display correct or suitable data. Further, if a reprojection operation takes longer than a suitable time threshold, aspects presented herein may configure a data read or data retrieval process in order to send bandwidth information for a DRAM that is within certain capabilities. Also, if a reprojection operation takes longer than a suitable time threshold, aspects presented herein may configure a data read or data retrieval process in order to avoid displaying visual artifacts to a user (e.g., a user wearing a headset or HMD). Aspects presented herein may modify a data read or data retrieval process by reading or retrieving data from an alternate location. For example, if a reprojection operation takes longer than a suitable time threshold, aspects presented herein may read/retrieve the data from a dynamic random access memory (DRAM) rather than reading/retrieving the data from a system cache or a shared cache (e.g., a cache that is shared between a producer/GPU and a consumer/DPU).

In some aspects, when the display processor is removing or retrieving the data from the cache (e.g., a system cache or a shared cache), there may be a backup cache or storage, such that the display processor may remove/retrieve data from the backup cache or storage. For example, the system cache or the shared cache may be backed-up by double data rate (DDR) memory (i.e., DDR-backed) or a DRAM. In some instances, aspects presented herein may store a default value in DDR or DRAM. For example, in some aspects, the default value may be stored in a display buffer or a default buffer in the DRAM or DDR. When the display processor is removing or retrieving the data from the cache (e.g., a system cache or a shared cache), this data may be removed or retrieved as a default value from the display buffer or a default buffer in the DRAM or DDR. This default value that is stored in DRAM or DDR may be a known color or a known value that may reduce the amount of visual artifacts for the user. For instance, the default value may be more suitable than having a random pixel value retrieved/removed from the cache that may create more visual artifacts for the user and/or be more visibly unappealing to the user.

Additionally, in some aspects, if the reprojection hardware takes longer than expected (i.e., longer than a suitable time threshold) to provide data or instructions (e.g., reprojection data), the data may be retrieved from the DDR or DRAM. For example, if the reprojection hardware (e.g., reprojection hardware at a GPU) takes longer than a suitable time threshold to provide certain data, and the display processor performs a read with invalidate function for the cache (e.g., a system cache or a shared cache) and does not find the data in the cache, the display processor may retrieve a known value. That is, if the reprojection hardware takes longer than a suitable time threshold to provide certain data, the display processor may retrieve the data from a display buffer or a default buffer in the DRAM or DDR. If the reprojection hardware takes less than a suitable time threshold to provide certain data, the display processor may retrieve the data from the cache (e.g., a system cache or a shared cache). Moreover, in some aspects, if the display processor performs a read with invalidate function for the cache, and the return is a cache miss, aspects presented herein may return a known value. For example, in the event of a cache miss after a read with invalidate instruction, aspects presented herein may return a known error value (e.g., a value of 0 or a known color). That is, in the event of a cache miss after a read with invalidate instruction, aspects presented herein may return a known error value that is stored in DDR memory or DRAM.

Aspects presented herein may utilize error handling mechanisms for missed timelines in a reprojection pipeline (e.g., an augmented reality (AR) reprojection pipeline). In some aspects, to save power in system-on-chips (SoCs) (e.g., AR SoCs), data shared in a producer consumer relationship may be allocated into certain types of memory (e.g., system random access memory (SRAM)), rather than allocated into other types of memory (e.g., dynamic random access memory (DRAM)). One example of this is a reprojection engine that does a warp or rendered frames based on a head-pose, which may in turn read by a display processor. The reprojection process may take a variable length of time based on: delays in availability of the head pose, a variable computation needed for a warp operation, a variation of memory access time for warp computation, etc. Aspects presented herein may utilize a read with invalidate access from a display processor in order to remove the data from the cache when read. The result is that, in a correct operation, there may be no evictions (or any other bandwidth) to the DRAM. Also, read access to the DRAM may solely occur when the display reads before the reprojection engine has written the relevant data (i.e., a timeline error). Further, the DRAM may be pre-configured with a default buffer that will be displayed on the timeline error to eliminate visual artifacts to the end user.

In some instances, aspects presented herein may use read with invalidate to remove or retrieve the data out of a cache (e.g., a system cache or a shared cache) in order to save or store the data. By utilizing this cache for a producer (e.g., a GPU) and a consumer (e.g., a DPU), aspects presented herein may saving the bandwidth from accessing DDR memory or a DRAM. Depending on the resolution of the retrieved data to be displayed, aspects presented herein may save a significant amount of bandwidth and/or power. Alternatively, if there is some determined amount of error, aspects presented herein may utilize a backup process to eventually read or retrieve the data from DDR or DRAM. For instance, if there is a known error in a data read/retrieval process (i.e., a cache miss), aspects presented herein may read/retrieve a known value from DDR or DRAM. Further, aspects presented herein may utilize error handling software that may intercept the error in the data read/retrieval process, and then attempts to reproject data that is similar.

Additionally, in some instances, aspects presented herein may utilize read with invalidate access (read-with-invalidate) from the display processor to remove the data from the cache (e.g., a system cache or shared cache) when the data is read. Also, in timely or correct operation (i.e., if the reprojection hardware takes less than a suitable time threshold to provide certain data), there may be no evictions of the data (or any other bandwidth) to DDR or DRAM. For instance, the read/retrieval access to DRAM may occur when a display processor reads/retrieves the data before the reprojection engine has written the relevant data (i.e., a timeline error). In some aspects, the DRAM may be pre-configured with a default buffer or a display buffer that will be utilized in the event of a timeline error. That is, the default buffer or display buffer may help to eliminate visual artifacts for a user when the display processor reads/retrieves the data before the reprojection engine has written the relevant data. In some instances, aspects presented herein may include two levels of caches, such as a first level cache and at least one second level cache. Data may be retrieved from a display buffer or default buffer based on an unsuccessful retrieval of the data from a first cache or a cache miss at the first cache (e.g., there is a request to retrieve data from a cache, but that specific data is not currently in the cache). If data is not being evicted from the first level cache to the at least one second level (e.g., because of a read-write indication), aspects presented herein may configure or prime the at least one second level cache with a known default buffer or a known error value buffer. The known default buffer or known error value buffer may be accessed upon a cache miss in the first level cache. For example, the known default buffer or known error value buffer may be accessed without any indication that there is a timeline error. Aspects presented herein may also optimize a user experience if the default buffer in DRAM corresponds to a transparency at the display. Further, in the presence of other compression techniques, aspects presented herein may minimize the bandwidth to DRAM for transparent data (e.g., 0x00 data). For example, the DRAM bandwidth may be reduced/optimized when utilizing a compression technique that optimizes the default background value. Also, certain metadata may help to reduce or optimize the amount of access to the DDR or DRAM (e.g., via a fast clear function). That is, as metadata is compressed, aspects presented herein may utilize the metadata to represent other data that may be accessed from the DDR or DRAM. Alternatively, aspects presented herein may utilize a cache feature that issues a known data value (e.g., a data value of 0x00) on a read miss or a cache miss.

Figure 11:
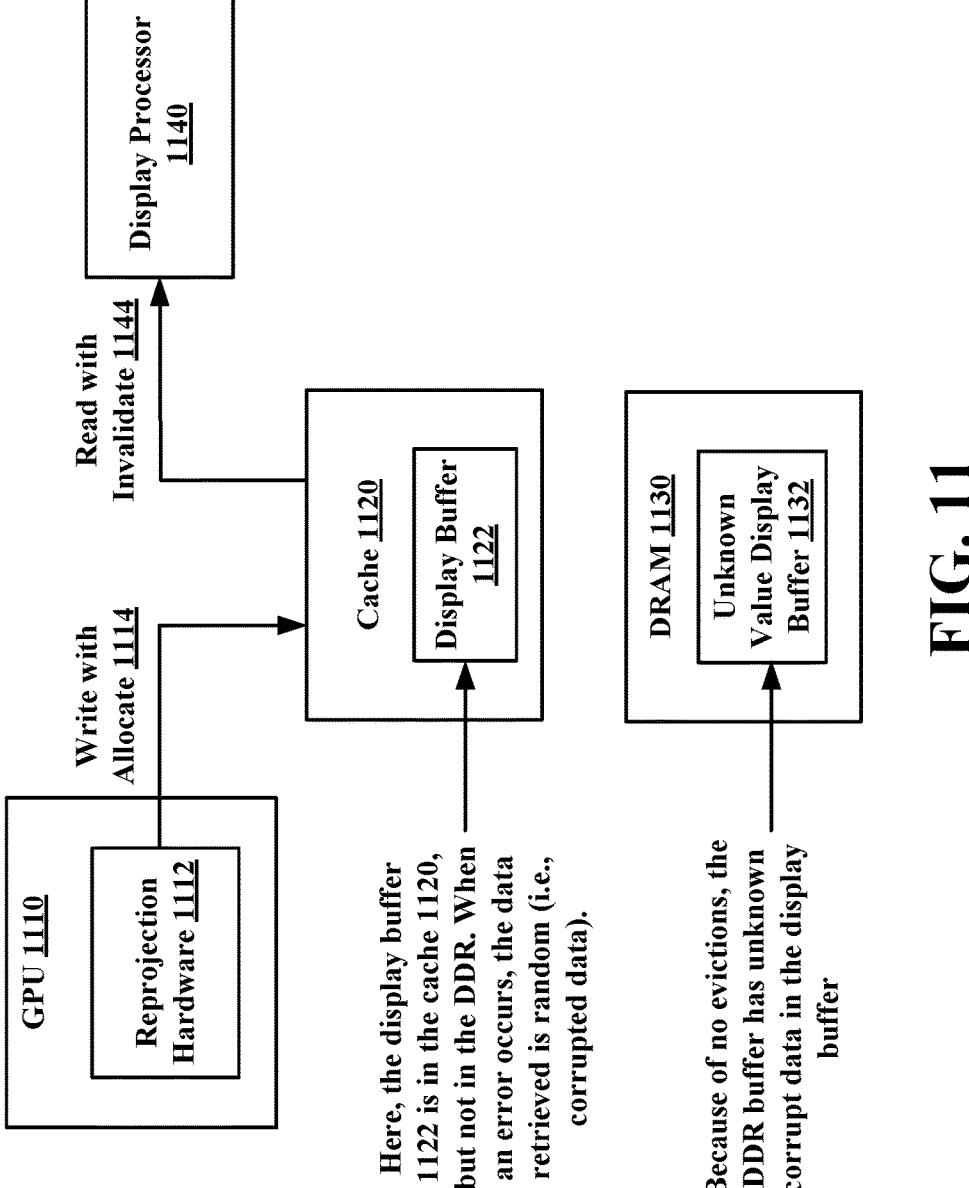
FIG. 11 is a diagram illustrating an example data retrieval process in a cache system.

FIG. 11 is a diagram 1100 illustrating an example data retrieval process in a cache system. More specifically, FIG. 11 depicts an example producer (e.g., a reprojection engine at a GPU) and consumer (display processor) retrieving data from a cache. As shown in FIG. 11, diagram 1100 includes GPU 1110 including reprojection hardware 1112, a write with allocate instruction 1114, a cache 1120 (e.g., a system cache or a shared cache) including a display buffer 1122 (e.g., a default buffer), a DRAM 1130 (e.g., DDR or a next-level cache) including unknown value display buffer 1132 (e.g., a default buffer which has unknown valued data), a display processor 1140, and a read with invalidate instruction 1144. FIG. 11 depicts that reprojection hardware 1112 may send the write with allocate instruction 1114 to cache 1120. A display processor 1140 may also send a read with invalidate instruction 1144 to the display processor 1140. As shown in FIG. 11, the write with allocate instruction 1114 and read with invalidate instruction 1144 may hit in the cache 1120, thereby avoiding access at the DRAM 1130. By allowing these instructions to hit in the cache 1120, in some aspects, this may reduce latency and save power. As shown in FIG. 11, there may be multiple instances of a buffer (e.g., display buffer 1122 and unknown value display buffer 1132). For both display buffer 1122 and unknown value display buffer 1132, the start address may be the same (e.g., 0xFF000000). Also, the data will be different due to no evictions from the cache 1120. As shown in FIG. 11, the read may miss in the cache 1120 due to a delay in reprojection, so the DRAM 1130 or DDR access may return an unknown corrupt value, which may be in the DRAM 1130 or DDR. As a result, a cache miss path may return corrupt data values resulting in a bad user experience.

Figure 12:
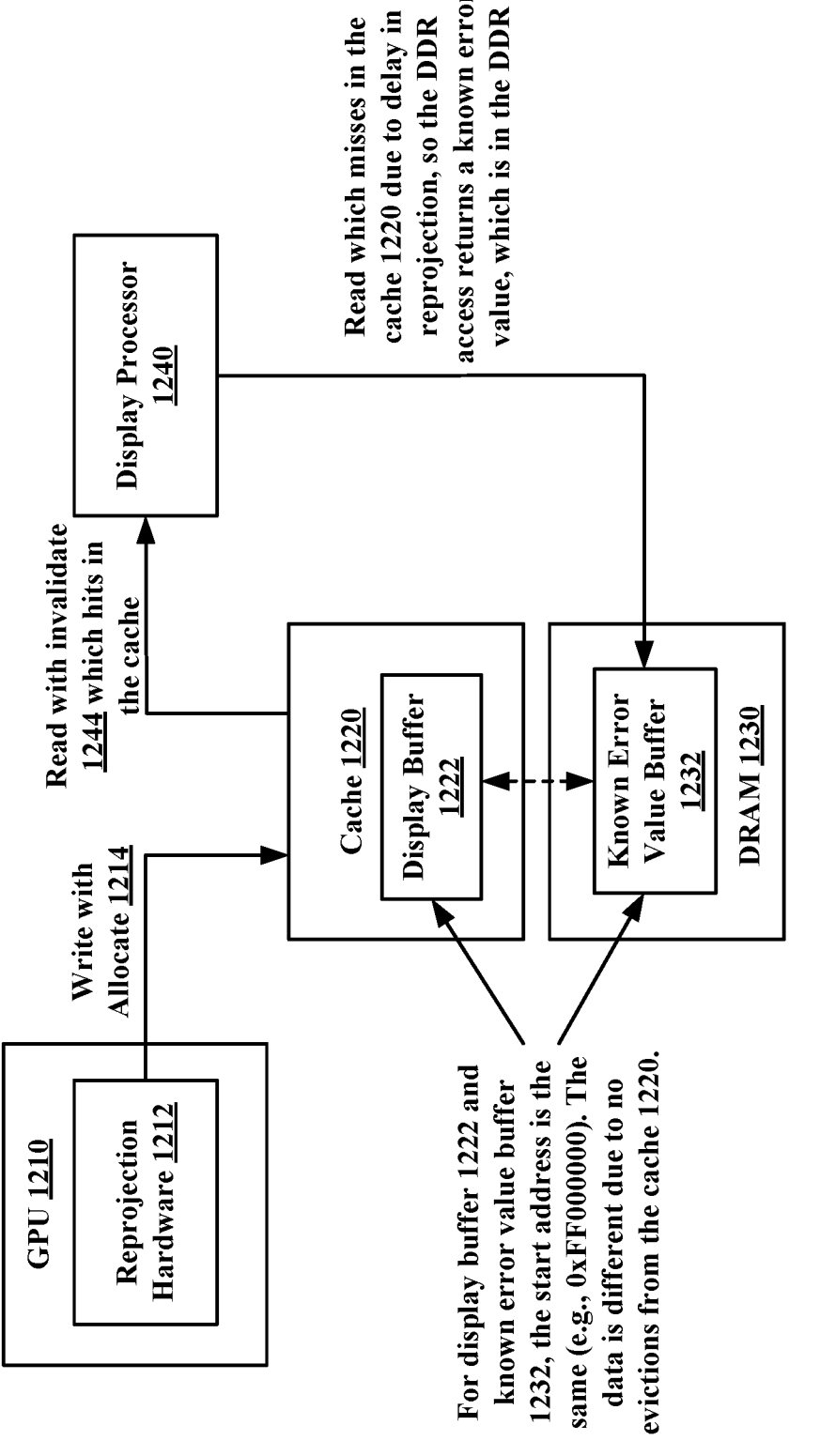
FIG. 12 is a diagram illustrating an example data retrieval process in a cache system.

FIG. 12 is a diagram 1200 illustrating an example data retrieval process in a cache system. More specifically, FIG. 12 depicts an example producer (e.g., a reprojection engine at a GPU) and consumer (display processor) retrieving data from a cache. As shown in FIG. 12, diagram 1200 includes GPU 1210 including reprojection hardware 1212 (e.g., reprojection hardware at a GPU), a write with allocate instruction 1214, a cache 1220 including a display buffer 1222 (e.g., a default buffer), a DRAM 1230 (e.g., DDR or a next-level cache) including known error value buffer 1232, a display processor 1240, and a read with invalidate instruction 1244 (which hits in the cache). FIG. 12 depicts that reprojection hardware 1212 may send a write with allocate instruction 1214 to cache 1220. Display processor 1240 may also send a read with invalidate instruction 1244, which hits in the cache, and returns the data to the display processor 1240. As shown in FIG. 12, the write with allocate instruction 1214 and read with invalidate instruction 1244 may hit in the cache 1220, thereby avoiding access at the DRAM 1230. By allowing these instructions to hit in the cache 1220, in some aspects, this may reduce latency and save power. As shown in FIG. 12, there may be multiple instances of a buffer (e.g., display buffer 1222 and known error value buffer 1232). For both display buffer 1222 and known error value buffer 1232, the start address may be the same (e.g., 0xFF000000). Also, the data may be different due to no evictions from the cache 1220. As shown in FIG. 12, the read may miss in the cache 1220 due to a delay in reprojection, so the DRAM 1230 or DDR access may return a known error value, which may be in the DRAM 1230 or DDR. As further depicted in FIG. 12, as data may not be evicted to DRAM 1230 or DDR from the cache 1220, software may be utilized to write an initial value to known error value buffer 1232 in DRAM 1230. Also, a cache miss path may be utilized to recover from errors (e.g., via delay in reprojection hardware).

As shown in FIG. 12, the write with allocate instruction 1214 and read with invalidate instruction 1244 may hit at the cache 1220 (e.g., at the display buffer 1222). For instance, if a reprojection operation takes less than a suitable time threshold, aspects presented herein may read/retrieve data (e.g., read with invalidate instruction 1244) from cache 1220 (e.g., a system cache or a shared cache). That is, the read/retrieval access from cache 1220 may occur when display processor 1240 reads/retrieves the data (e.g., read with invalidate instruction 1244) after the reprojection hardware 1212 has written the relevant data. Also, if a reprojection operation takes longer than a suitable time threshold, aspects presented herein may read/retrieve the data (e.g., read with invalidate instruction 1244) from the DRAM 1230 (e.g., the known error value buffer 1232). That is, the read/retrieval access from DRAM 1230 (e.g., at the known error value buffer 1232) may occur when display processor 1240 reads/retrieves the data (e.g., read with invalidate instruction 1244) before the reprojection hardware 1212 has written the relevant data (i.e., a timeline error).

As shown in FIG. 12, aspects presented herein may obtain an indication of a data write for data associated with the data processing (e.g., cache 1220 may obtain write with allocate instruction 1214 from reprojection hardware 1212 in GPU 1210. A "data write" may refer to a write instruction to an address means to update the memory location in DDR with new data. A "reprojection" may refer to a process which updates previously-rendered frames with new motion information. The reprojection (also referred to as "reprojecting" or "warping") may take an older frame and extrapolate what the new frame would look like. Also, aspects presented herein may write, based on the indication, the data associated with the data processing to a memory address (e.g., cache 1220 may write that data for write with allocate instruction 1214). Aspects presented herein may also receive a read request for the data including the memory address, where the read request is associated with a read with invalidate process (e.g., cache 1220 may receive read with invalidate instruction 1244 from display processor 1240). A "read request" may refer to a transaction that a processor sends to caches/DDR to an address in memory. The result of this transaction may be to obtain the data either from the cache (if it is there since it is checked first) or from DDR. As indicated above, a "read with invalidate" process may refer to a read transaction which, when it hits in the cache (i.e., finds the data), it returns the data but also invalidates the data (e.g., sets the valid bit to a value of 0), so the replacement policy can replace it next with a new line. Further, aspects presented herein may retrieve, based on the read request, the data from at least one of a first cache (e.g., cache 1220) or at least one second memory (e.g., DRAM 1230 including known error value buffer 1232), where the retrieval of the data is based on a timing of the indication of the data write (e.g., write with allocate instruction 1214). Aspects presented herein may also output the retrieved data from at least one of the first cache (e.g., cache 1220 including display buffer 1222) or the at least one second memory (e.g., DRAM 1230 including known error value buffer 1232).

In some instances, aspects presented herein may detect whether the timing of the indication of the data write (e.g., write with allocate instruction 1214) is greater than a timing threshold (e.g., a threshold configured by a GPU, a DPU, or a cache), where the retrieval of the data is based on the detection. For instance, if the timing of the indication of the data write (e.g., write with allocate instruction 1214) is less than or equal to the timing threshold, and retrieving the data may include: retrieving the data from the first cache (e.g., cache 1220). The timing of the indication being less than or equal to the timing threshold may be associated with a suitable timeline for the data processing. If the timing of the indication of the data write (e.g., write with allocate instruction 1214) is greater than the timing threshold, and retrieving the data may include: retrieving the data from the at least one second memory (e.g., DRAM 1230 including known error value buffer 1232). The timing of the indication being greater than the timing threshold may be associated with an unsuitable timeline or a timeline error for the data processing.

Additionally, the at least one second memory (e.g., DRAM 1230) may include at least one of a display buffer or a default buffer (e.g., known error value buffer 1232), and retrieving the data from the at least one second memory (e.g., DRAM 1230) may include: retrieving the data from at least one of the display buffer or the default buffer (e.g., known error value buffer 1232). A "display buffer" or "default buffer" may be a buffer which contains values used by the display processor. A display buffer or default buffer may be similar to a pixel buffer. A display buffer or default buffer may follow some standardized encoding which allows the display processor to display the buffer (i.e., show an image). A "known error value buffer" may be a buffer that returns a known error value. Aspects presented herein may also configure the at least one second memory (e.g., DRAM 1230) with at least one of the display buffer or the default buffer (e.g., known error value buffer 1232), and retrieving the data may include: retrieving the data from at least one of the configured display buffer or the configured default buffer (e.g., known error value buffer 1232). Further, the at least one second memory (e.g., DRAM 1230) may be preconfigured with at least one of the display buffer or the default buffer (e.g., known error value buffer 1232), where retrieving the data may include: retrieving the data from at least one of the preconfigured display buffer or the preconfigured default buffer (e.g., known error value buffer 1232). In some instances, the retrieval of the data from at least one of the display buffer or the default buffer (e.g., known error value buffer 1232) may be based on an unsuccessful retrieval of the data from the first cache or a cache miss at the first cache (e.g., there is a request to retrieve data from a cache, but that specific data is not currently in the cache). For instance, aspects presented herein may include two levels of caches, such as a first level cache and at least one second level cache. If data is not being evicted from the first level cache to the at least one second level (e.g., because of a read-write indication), aspects presented herein may configure or prime the at least one second level cache with a known default buffer or a known error value buffer (e.g., known error value buffer 1232). The known default buffer or known error value buffer (e.g., known error value buffer 1232) may be accessed upon a cache miss in the first level cache. For example, the known default buffer or known error value buffer (e.g., known error value buffer 1232) may be accessed without any indication that there is a timeline error.

Moreover, retrieving the data from the first cache (e.g., cache 1220 including display buffer 1222) may include: reading the data directly from the first cache (e.g., cache 1220 including display buffer 1222). In some instances, the read request may be a read with invalidate request (e.g., read with invalidate instruction 1244) associated with the read with invalidate process, where reading the data directly from the first cache (e.g., cache 1220) may include: reading the data directly from the first cache (e.g., cache 1220); and invalidating the data from the first cache (e.g., cache 1220). A "read" may refer to a process that is sent to caches/DDR to an address in memory. "Invalidating data" may refer to an invalidation of data in a caches that corresponds to setting the valid bit to a value of 0, which means the data does not exist anymore in the system (e.g., the DDR never sees the data, so it does not exist). Also, retrieving the data from the at least one second memory (e.g., DRAM 1230) may include: transmitting, to the at least one second memory (e.g., DRAM 1230), a request for the data; and receiving the data from the at least one second memory (e.g., DRAM 1230) based on the request. In some aspects, the memory address may be located at the first cache (e.g., cache 1220), and writing the data associated with the data processing may include: storing, in the memory address at the first cache (e.g., cache 1220), the data associated with the data processing.

Aspects presented herein may include a number of benefits or advantages. For instance, aspects presented herein may adjust a data read or data retrieval process if a reprojection operation is delayed or slower than a desired timeline. In some aspects, if a reprojection operation takes longer than a suitable time threshold, aspects presented herein may modify a data read or data retrieval process in order to display correct or suitable data. Moreover, if a reprojection operation takes longer than a suitable time threshold, aspects presented herein may alter a data read or data retrieval process in order to send bandwidth information for a DRAM that is within certain capabilities. Additionally, if a reprojection operation takes longer than a suitable time threshold, aspects presented herein may modify a data read or data retrieval process in order to avoid displaying visual artifacts to a user (e.g., a user wearing a headset or HMD). Aspects presented herein may modify a data read or data retrieval process by reading or retrieving data from an alternate location. For example, if a reprojection operation takes longer than a suitable time threshold, aspects presented herein may read/retrieve the data from a dynamic random access memory (DRAM) rather than reading/retrieving the data from a system cache or a shared cache (e.g., a cache that is shared between a producer/GPU and a consumer/DPU). Also, aspects presented herein may reduce bandwidth (e.g., DDR bandwidth or DRAM bandwidth) and/or improve robustness of the system under heavy concurrency by leveraging error handing capabilities. Aspects presented herein may also be utilized in a reprojection engine (e.g., a reprojection engine at a GPU) for buffers handed to be displayed.

Aspects presented herein may also provide a number of performance benefits, such as reducing the amount of bandwidth and/or power utilized. For example, for a field sequential display (FSD) including a certain resolution (e.g., a resolution of 1280×960 at 120 Hz), aspects presented herein may provide a bandwidth savings (e.g., a bandwidth savings of 600 MB/s) and a power savings (e.g., a power savings of 35 mW). For an FSD including a certain resolution (e.g., a resolution of 1824×1352 at 120 Hz), aspects presented herein may provide a bandwidth savings (e.g., a bandwidth savings of 1,212 MB/s) and a power savings (e.g., a power savings of 71 mW). For a red, green, blue (RGB) display including a certain resolution (e.g., a resolution of 1824× 1352 at 120 Hz), aspects presented herein may provide a bandwidth savings (e.g., a bandwidth savings of 1,692 MB/s) and a power savings (e.g., a power savings of 99 mW). Additionally, aspects presented herein may detecting reprojection errors, which may reduce a need for other ways to detect reprojection errors. Aspects presented herein may also utilize a software sequence to recover from timeline errors, which may reduce a need for other ways to recover from timeline errors.

Figure 13:
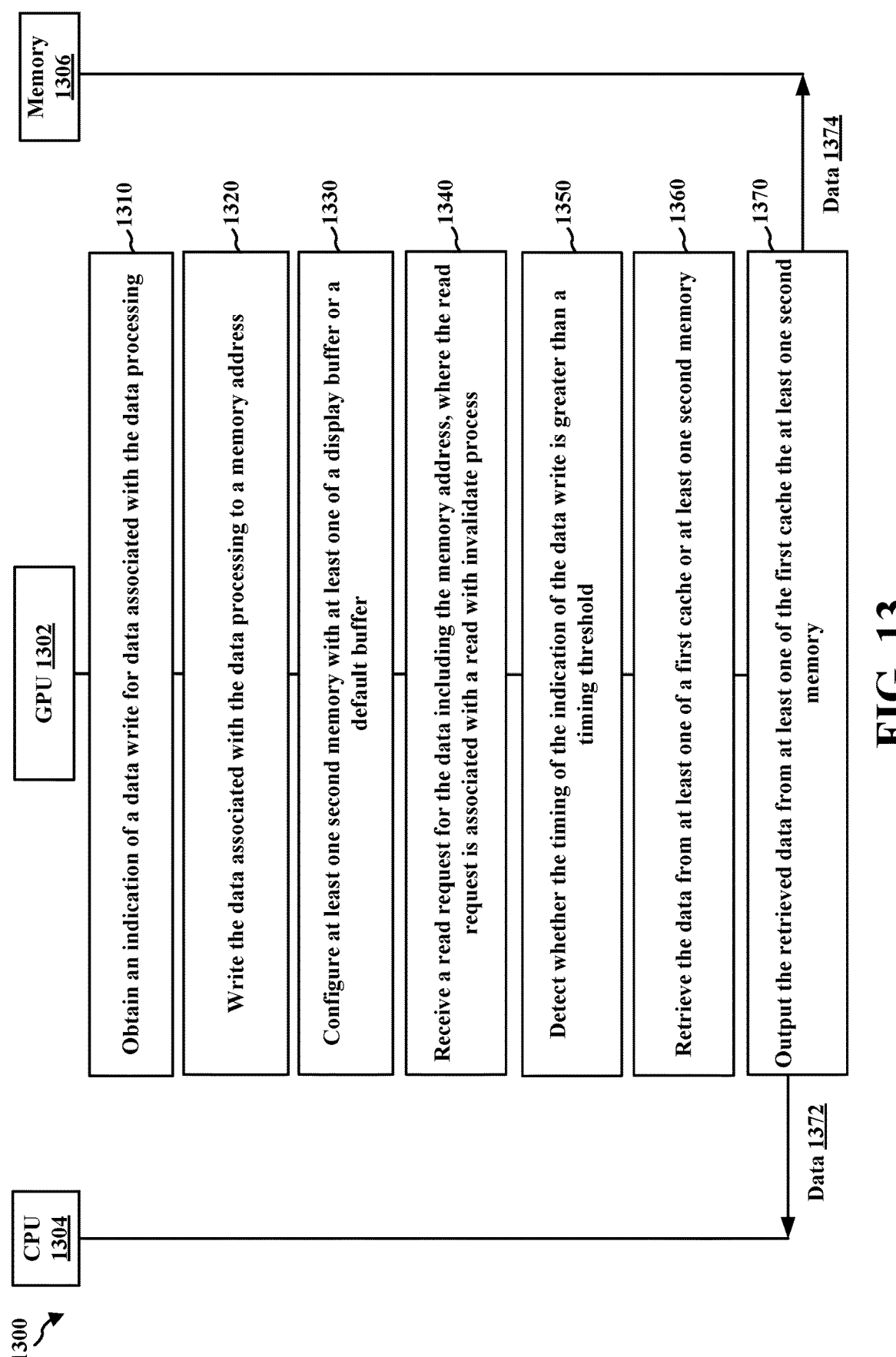
FIG. 13 is a communication flow diagram illustrating example communications between a GPU, a CPU, and a memory.

FIG. 13 is a communication flow diagram 1300 of data processing or graphics processing in accordance with one or more techniques of this disclosure. As shown in FIG. 13, diagram 1300 includes example communications between GPU 1302 (e.g., a GPU, a cache at a GPU, a GPU component, another graphics processor, a CPU, a CPU component, or another central processor), CPU 1304 (e.g., a CPU, a cache at a CPU, a CPU component, another central processor, a GPU, a GPU component, or another graphics processor), and memory 1306 (e.g., a system memory, a graphics memory, or a memory or cache at a GPU), in accordance with one or more techniques of this disclosure.

At 1310, GPU 1302 may obtain an indication of a data write for data associated with the data processing. In some aspects, the data write for the data may be associated with a reprojection process for the data processing. Also, obtaining the indication of the data write may include: obtaining the indication of the data write from reprojection hardware at a graphics processing unit (GPU), and the reprojection hardware may be associated with the reprojection process for the data processing. The data associated with the data processing may be at least one of: pixel data, sub-pixel data, texture pixel (texel) data, or color data.

At 1320, GPU 1302 may write, based on the indication, the data associated with the data processing to a memory address. The memory address may be located at a first cache, and writing the data associated with the data processing may include: storing, in the memory address at the first cache, the data associated with the data processing.

In some aspects, the at least one second memory may include at least one of a display buffer or a default buffer, and retrieving the data from the at least one second memory may include: retrieving the data from at least one of the display buffer or the default buffer. In some instances, the retrieval of the data from at least one of the display buffer or the default buffer may be based on an unsuccessful retrieval of the data from the first cache or a cache miss at the first cache. Also, the at least one second memory may be preconfigured with at least one of the display buffer or the default buffer, where retrieving the data may include: retrieving the data from at least one of the preconfigured display buffer or the preconfigured default buffer.

At 1330, GPU 1302 may configure at least one second memory with at least one of the display buffer or the default buffer. Also, retrieving the data may include: retrieving the data from at least one of the configured display buffer or the configured default buffer.

At 1340, GPU 1302 may receive a read request for the data including the memory address, where the read request is associated with a read with invalidate process. In some aspects, receiving the read request for the data may include (e.g., comprise): receiving the read request from at least one of: a consumer device, a controller, a processor, a display processor, or a display processing unit (DPU).

At 1350, GPU 1302 may detect whether the timing of the indication of the data write is greater than a timing threshold. In some aspects, if the timing of the indication of the data write is less than or equal to the timing threshold, retrieving the data may include: retrieving the data from the first cache. The timing of the indication being less than or equal to the timing threshold may be associated with a suitable timeline for the data processing. If the timing of the indication of the data write is greater than the timing threshold, retrieving the data may include: retrieving the data from the at least one second memory. The timing of the indication being greater than the timing threshold may be associated with an unsuitable timeline or a timeline error for the data processing.

At 1360, GPU 1302 may retrieve, based on the read request, the data from at least one of a first cache or at least one second memory, where the retrieval of the data is based on a timing of the indication of the data write. In some aspects, the retrieval of the data may be based on the detection (e.g., the detection at 1350). Also, retrieving the data may include: retrieving the data from at least one of the configured display buffer or the configured default buffer (e.g., the configuration at 1330). In some instances, retrieving the data from the first cache may include: reading the data directly from the first cache. Also, the read request may be a read with invalidate request associated with the read with invalidate process, where reading the data directly from the first cache may include: reading the data directly from the first cache; and invalidating the data from the first cache.

In some aspects, retrieving the data from the at least one second memory may include: transmitting, to the at least one second memory, a request for the data; and receiving the data from the at least one second memory based on the request. In some aspects, the first cache may be a system cache or a shared cache, and the at least one second memory may be a dynamic random access memory (DRAM), a DDR, or a next level cache. Also, the shared cache may be shared between a first device and a second device, where the first device may be a producer device, a first controller, a first processor, a graphics processor, or a GPU, and where the second device may be a consumer device, a second controller, a second processor, a display processor, or a display processing unit (DPU). Also, retrieving the data from the first cache may include: retrieving the data from the first cache based on the timing of the indication of the data write being less than or equal to a timing threshold, and retrieving the data from the at least one second memory may include: retrieving the data from the at least one second memory based on the timing of the indication of the data write being greater than the timing threshold.

At 1370, GPU 1302 may output the retrieved data from at least one of the first cache or the at least one second memory. In some aspects, outputting the retrieved data may include: transmitting the retrieved data to at least one of: a consumer device, a controller, a processor, a display processor, or a display processing unit (DPU). For example, GPU 1302 may transmit the retrieved data (e.g., data 1372) to CPU 1304. Also, outputting the retrieved data may include: storing the retrieved data in at least one other cache or at least one other memory. For example, GPU 1302 may store the retrieved data (e.g., data 1374) in memory 1306.

FIG. 14 is a flowchart 1400 of an example method of data processing or graphics processing in accordance with one or more techniques of this disclosure. The method may be performed by a GPU (e.g., a GPU, a cache at a GPU, a GPU component, another graphics processor, a CPU, a CPU component, or another central processor), a CPU (e.g., a CPU, a cache at a CPU, a CPU component, another central processor, a GPU, a GPU component, or another graphics processor), a display driver integrated circuit (DDIC), an apparatus for data or graphics processing, a wireless communication device, and/or any apparatus that may perform data or graphics processing as used in connection with the examples of FIGS. 1-13.

At 1402, the GPU may obtain an indication of a data write for data associated with the data processing, as described in connection with the examples in FIGS. 1-13. For example, as described in 1310 of FIG. 13, GPU 1302 may obtain an indication of a data write for data associated with the data processing. Further, step 1402 may be performed by processing unit 120 in FIG. 1. In some aspects, the data write for the data may be associated with a reprojection process for the data processing. Also, obtaining the indication of the data write may include: obtaining the indication of the data write from reprojection hardware at a graphics processing unit (GPU), and the reprojection hardware may be associated with the reprojection process for the data processing. The data associated with the data processing may be at least one of: pixel data, sub-pixel data, texture pixel (texel) data, or color data.

At 1404, the GPU may write, based on the indication, the data associated with the data processing to a memory address, as described in connection with the examples in FIGS. 1-13. For example, as described in 1320 of FIG. 13, GPU 1302 may write, based on the indication, the data associated with the data processing to a memory address.

Further, step 1404 may be performed by processing unit 120 in FIG. 1. The memory address may be located at a first cache, and writing the data associated with the data processing may include: storing, in the memory address at the first cache, the data associated with the data processing. In some aspects, the at least one second memory may include at least one of a display buffer or a default buffer, and retrieving the data from the at least one second memory may include: retrieving the data from at least one of the display buffer or the default buffer. In some instances, the retrieval of the data from at least one of the display buffer or the default buffer may be based on an unsuccessful retrieval of the data from the first cache or a cache miss at the first cache. Also, the at least one second memory may be preconfigured with at least one of the display buffer or the default buffer, where retrieving the data may include: retrieving the data from at least one of the preconfigured display buffer or the preconfigured default buffer.

At 1408, the GPU may receive a read request for the data including the memory address, where the read request is associated with a read with invalidate process, as described in connection with the examples in FIGS. 1-13. For example, as described in 1340 of FIG. 13, GPU 1302 may receive a read request for the data including the memory address, where the read request is associated with a read with invalidate process. Further, step 1408 may be performed by processing unit 120 in FIG. 1. In some aspects, receiving the read request for the data may include (e.g., comprise): receiving the read request from at least one of: a consumer device, a controller, a processor, a display processor, or a display processing unit (DPU).

At 1412, the GPU may retrieve, based on the read request, the data from at least one of a first cache or at least one second memory, where the retrieval of the data is based on a timing of the indication of the data write, as described in connection with the examples in FIGS. 1-13. For example, as described in 1360 of FIG. 13, GPU 1302 may retrieve, based on the read request, the data from at least one of a first cache or at least one second memory. Further, step 1412 may be performed by processing unit 120 in FIG. 1. In some aspects, the retrieval of the data may be based on the detection (e.g., the detection at 1350). Also, retrieving the data may include: retrieving the data from at least one of the configured display buffer or the configured default buffer (e.g., the configuration at 1330). In some instances, retrieving the data from the first cache may include: reading the data directly from the first cache. Also, the read request may be a read with invalidate request associated with the read with invalidate process, where reading the data directly from the first cache may include: reading the data directly from the first cache; and invalidating the data from the first cache. In some aspects, retrieving the data from the at least one second memory may include: transmitting, to the at least one second memory, a request for the data; and receiving the data from the at least one second memory based on the request. In some aspects, the first cache may be a system cache or a shared cache, and the at least one second memory may be a dynamic random access memory (DRAM), a DDR, or a next level cache. Also, the shared cache may be shared between a first device and a second device, where the first device may be a producer device, a first controller, a first processor, a graphics processor, or a graphics processing unit (GPU), and where the second device may be a consumer device, a second controller, a second processor, a display processor, or a display processing unit (DPU). Also, retrieving the data from the first cache may include: retrieving the data from the first cache based on the timing of the indication of the data write being less than or equal to a timing threshold, and retrieving the data from the at least one second memory may include: retrieving the data from the at least one second memory based on the timing of the indication of the data write being greater than the timing threshold.

At 1414, the GPU may output the retrieved data from at least one of the first cache or the at least one second memory, as described in connection with the examples in FIGS. 1-13. For example, as described in 1370 of FIG. 13, GPU 1302 may output the retrieved data from at least one of the first cache or the at least one second memory. Further, step 1414 may be performed by processing unit 120 in FIG. 1. In some aspects, outputting the retrieved data may include: transmitting the retrieved data to at least one of: a consumer device, a controller, a processor, a display processor, or a display processing unit (DPU). For example, the GPU may transmit the retrieved data to a CPU. Also, outputting the retrieved data may include: storing the retrieved data in at least one other cache or at least one other memory. For example, the GPU may store the retrieved data in a memory.

FIG. 15 is a flowchart 1500 of an example method of data processing or graphics processing in accordance with one or more techniques of this disclosure. The method may be performed by a GPU (e.g., a GPU, a cache at a GPU, a GPU component, another graphics processor, a CPU, a CPU component, or another central processor), a CPU (e.g., a CPU, a cache at a CPU, a CPU component, another central processor, a GPU, a GPU component, or another graphics processor), a display driver integrated circuit (DDIC), an apparatus for data or graphics processing, a wireless communication device, and/or any apparatus that may perform data or graphics processing as used in connection with the examples of FIGS. 1-13.

At 1502, the GPU may obtain an indication of a data write for data associated with the data processing, as described in connection with the examples in FIGS. 1-13. For example, as described in 1310 of FIG. 13, GPU 1302 may obtain an indication of a data write for data associated with the data processing. Further, step 1502 may be performed by processing unit 120 in FIG. 1. In some aspects, the data write for the data may be associated with a reprojection process for the data processing. Also, obtaining the indication of the data write may include: obtaining the indication of the data write from reprojection hardware at a graphics processing unit (GPU), and the reprojection hardware may be associated with the reprojection process for the data processing. The data associated with the data processing may be at least one of: pixel data, sub-pixel data, texture pixel (texel) data, or color data.

At 1504, the GPU may write, based on the indication, the data associated with the data processing to a memory address, as described in connection with the examples in FIGS. 1-13. For example, as described in 1320 of FIG. 13, GPU 1302 may write, based on the indication, the data associated with the data processing to a memory address. Further, step 1504 may be performed by processing unit 120 in FIG. 1. The memory address may be located at a first cache, and writing the data associated with the data processing may include: storing, in the memory address at the first cache, the data associated with the data processing. In some aspects, the at least one second memory may include at least one of a display buffer or a default buffer, and retrieving the data from the at least one second memory may include: retrieving the data from at least one of the display buffer or the default buffer. In some instances, the retrieval of the data from at least one of the display buffer or the default buffer may be based on an unsuccessful retrieval of the data from the first cache or a cache miss at the first cache. Also, the at least one second memory may be preconfigured with at least one of the display buffer or the default buffer, where retrieving the data may include: retrieving the data from at least one of the preconfigured display buffer or the preconfigured default buffer.

At 1506, the GPU may configure at least one second memory with at least one of the display buffer or the default buffer, as described in connection with the examples in FIGS. 1-13. For example, as described in 1330 of FIG. 13, GPU 1302 may configure at least one second memory with at least one of the display buffer or the default buffer. Further, step 1506 may be performed by processing unit 120 in FIG. 1. Also, retrieving the data may include: retrieving the data from at least one of the configured display buffer or the configured default buffer.

At 1508, the GPU may receive a read request for the data including the memory address, where the read request is associated with a read with invalidate process, as described in connection with the examples in FIGS. 1-13. For example, as described in 1340 of FIG. 13, GPU 1302 may receive a read request for the data including the memory address, where the read request is associated with a read with invalidate process. Further, step 1508 may be performed by processing unit 120 in FIG. 1. In some aspects, receiving the read request for the data may include (e.g., comprise): receiving the read request from at least one of: a consumer device, a controller, a processor, a display processor, or a display processing unit (DPU).

At 1510, the GPU may detect whether the timing of the indication of the data write is greater than a timing threshold, as described in connection with the examples in FIGS. 1-13. For example, as described in 1350 of FIG. 13, GPU 1302 may detect whether the timing of the indication of the data write is greater than a timing threshold. Further, step 1510 may be performed by processing unit 120 in FIG. 1. In some aspects, if the timing of the indication of the data write is less than or equal to the timing threshold, retrieving the data may include: retrieving the data from the first cache. The timing of the indication being less than or equal to the timing threshold may be associated with a suitable timeline for the data processing. If the timing of the indication of the data write is greater than the timing threshold, retrieving the data may include: retrieving the data from the at least one second memory. The timing of the indication being greater than the timing threshold may be associated with an unsuitable timeline or a timeline error for the data processing.

At 1512, the GPU may retrieve, based on the read request, the data from at least one of a first cache or at least one second memory, where the retrieval of the data is based on a timing of the indication of the data write, as described in connection with the examples in FIGS. 1-13. For example, as described in 1360 of FIG. 13, GPU 1302 may retrieve, based on the read request, the data from at least one of a first cache or at least one second memory. Further, step 1512 may be performed by processing unit 120 in FIG. 1. In some aspects, the retrieval of the data may be based on the detection (e.g., the detection at 1350). Also, retrieving the data may include: retrieving the data from at least one of the configured display buffer or the configured default buffer (e.g., the configuration at 1330). In some instances, retrieving the data from the first cache may include: reading the data directly from the first cache. Also, the read request may be a read with invalidate request associated with the read with invalidate process, where reading the data directly from the first cache may include: reading the data directly from the first cache; and invalidating the data from the first cache. In some aspects, retrieving the data from the at least one second memory may include: transmitting, to the at least one second memory, a request for the data; and receiving the data from the at least one second memory based on the request. In some aspects, the first cache may be a system cache or a shared cache, and the at least one second memory may be a dynamic random access memory (DRAM), a DDR, or a next level cache. Also, the shared cache may be shared between a first device and a second device, where the first device may be a producer device, a first controller, a first processor, a graphics processor, or a graphics processing unit (GPU), and where the second device may be a consumer device, a second controller, a second processor, a display processor, or a display processing unit (DPU). Also, retrieving the data from the first cache may include: retrieving the data from the first cache based on the timing of the indication of the data write being less than or equal to a timing threshold, and retrieving the data from the at least one second memory may include: retrieving the data from the at least one second memory based on the timing of the indication of the data write being greater than the timing threshold.

At 1514, the GPU may output the retrieved data from at least one of the first cache or the at least one second memory, as described in connection with the examples in FIGS. 1-13. For example, as described in 1370 of FIG. 13, GPU 1302 may output the retrieved data from at least one of the first cache or the at least one second memory. Further, step 1514 may be performed by processing unit 120 in FIG. 1. In some aspects, outputting the retrieved data may include: transmitting the retrieved data to at least one of: a consumer device, a controller, a processor, a display processor, or a display processing unit (DPU). For example, the GPU may transmit the retrieved data to a CPU. Also, outputting the retrieved data may include: storing the retrieved data in at least one other cache or at least one other memory. For example, the GPU may store the retrieved data in a memory.

In configurations, a method or an apparatus for data or graphics processing is provided. The apparatus may be a GPU (or other graphics processor), a CPU (or other central processor), a DDIC, an apparatus for graphics processing, and/or some other processor that may perform data or graphics processing. In aspects, the apparatus may be the processing unit 120 within the device 104, or may be some other hardware within the device 104 or another device. The apparatus, e.g., processing unit 120, may include means for obtaining an indication of a data write for data associated with the data processing. The apparatus, e.g., processing unit 120, may also include means for writing, based on the indication, the data associated with the data processing to a memory address. The apparatus, e.g., processing unit 120, may also include means for receiving a read request for the data including the memory address, where the read request is associated with a read with invalidate process. The apparatus, e.g., processing unit 120, may also include means for retrieving, based on the read request, the data from at least one of a first cache or at least one second memory, where the retrieval of the data is based on a timing of the indication of the data write. The apparatus, e.g., processing unit 120, may also include means for outputting the retrieved data from at least one of the first cache or the at least one second memory. The apparatus, e.g., processing unit 120, may also include means for detecting whether the timing of the indication of the data write is greater than a timing threshold, where the retrieval of the data is based on the detection. The apparatus, e.g., processing unit 120, may also include means for configuring the at least one second memory with at least one of the display buffer or the default buffer, where retrieving the data comprises: retrieving the data from at least one of the configured display buffer or the configured default buffer.

The subject matter described herein may be implemented to realize one or more benefits or advantages. For instance, the described data or graphics processing techniques may be used by a cache, a GPU, a CPU, a central processor, or some other processor that may perform data or graphics processing to implement the reprojection timeline error handling techniques described herein. This may also be accomplished at a low cost compared to other data or graphics processing techniques. Moreover, the data or graphics processing techniques herein may improve or speed up data processing or execution. Further, the data or graphics processing techniques herein may improve resource or data utilization and/or resource efficiency. Additionally, aspects of the present disclosure may utilize reprojection timeline error handling techniques in order to improve memory bandwidth efficiency and/or increase processing speed at a cache, a GPU, a CPU, or a DPU.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects.

Unless specifically stated otherwise, the term "some" refers to one or more and the term "or" may be interpreted as "and/or" where context does not dictate otherwise. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism,"

"element," "device," and the like may not be a substitute for the word "means." As such, no claim element is to be construed as a means plus function unless the element is expressly recited using the phrase "means for."

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium.

In accordance with this disclosure, the term "or" may be interpreted as "and/or" where context does not dictate otherwise. Additionally, while phrases such as "one or more" or "at least one" or the like may have been used for some features disclosed herein but not others, the features for which such language was not used may be interpreted to have such a meaning implied where context does not dictate otherwise.

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium. Computer-readable media may include computer data storage media or communication media including any medium that facilitates transfer of a computer program from one place to another. In this manner, computer-readable media generally may correspond to (1) tangible computer-readable storage media, which is non-transitory or (2) a communication medium such as a signal or carrier wave. Data storage media may be any available media that may be accessed by one or more computers or one or more processors to retrieve instructions, code and/or data structures for implementation of the techniques described in this disclosure. By way of example, and not limitation, such computer-readable media may comprise RAM, ROM, EEPROM, CD-ROM or other optical disk storage, magnetic disk storage or other magnetic storage devices. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. A computer program product may include a computer-readable medium.

The code may be executed by one or more processors, such as one or more digital signal processors (DSPs), general purpose microprocessors, application specific integrated circuits (ASICs), arithmetic logic units (ALUs), field programmable logic arrays (FPGAs), or other equivalent integrated or discrete logic circuitry. Accordingly, the term "processor," as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs, e.g., a chip set. Various components, modules or units are described in this disclosure to emphasize functional aspects of devices configured to perform the disclosed techniques, but do not necessarily need realization by different hardware units. Rather, as described above, various units may be combined in any hardware unit or provided by a collection of inter-operative hardware units, including one or more processors as described above, in conjunction with suitable software and/or firmware. Accordingly, the term "processor," as used herein may refer to any of the foregoing structure or any other structure suitable for implementation of the techniques described herein. Also, the techniques may be fully implemented in one or more circuits or logic elements.

The following aspects are illustrative only and may be combined with other aspects or teachings described herein, without limitation.

Aspect 1 is an apparatus for data processing, including at least one memory and at least one processor coupled to the at least one memory and, based at least in part on information stored in the at least one memory, the at least one processor, individually or in any combination, is configured to: obtain an indication of a data write for data associated with the data processing; write, based on the indication, the data associated with the data processing to a memory address; receive a read request for the data including the memory address, wherein the read request is associated with a read with invalidate process; retrieve, based on the read request, the data from at least one of a first cache or at least one second memory, wherein the retrieval of the data is based on a timing of the indication of the data write; and output the retrieved data from at least one of the first cache or the at least one second memory.

Aspect 2 is the apparatus of aspect 1, where the at least one processor, individually or in any combination, is further configured to: detect whether the timing of the indication of the data write is greater than a timing threshold, where the retrieval of the data is based on the detection.

Aspect 3 is the apparatus of aspect 2, where the timing of the indication of the data write is less than or equal to the timing threshold, and where to retrieve the data, the at least one processor, individually or in any combination, is configured to: retrieve the data from the first cache.

Aspect 4 is the apparatus of aspect 3, where the timing of the indication being less than or equal to the timing threshold is associated with a suitable timeline for the data processing.

Aspect 5 is the apparatus of aspect 2, where the timing of the indication of the data write is greater than the timing threshold, and where to retrieve the data, the at least one processor, individually or in any combination, is configured to: retrieve the data from the at least one second memory.

Aspect 6 is the apparatus of aspect 5, where the timing of the indication being greater than the timing threshold is associated with an unsuitable timeline or a timeline error for the data processing.

Aspect 7 is the apparatus of any of aspects 1 to 6, where the at least one second memory includes at least one of a display buffer or a default buffer, and wherein to retrieve the data from the at least one second memory, the at least one processor, individually or in any combination, is configured to: retrieve the data from at least one of the display buffer or the default buffer.

Aspect 8 is the apparatus of aspect 7, where the at least one processor, individually or in any combination, is further configured to: configure the at least one second memory with at least one of the display buffer or the default buffer, wherein to retrieve the data, the at least one processor, individually or in any combination, is configured to: retrieve the data from at least one of the configured display buffer or the configured default buffer.

Aspect 9 is the apparatus of aspect 7, where the at least one second memory is preconfigured with at least one of the display buffer or the default buffer, wherein to retrieve the data, the at least one processor, individually or in any combination, is configured to: retrieve the data from at least one of the preconfigured display buffer or the preconfigured default buffer.

Aspect 10 is the apparatus of any of aspects 7 to 9, where the retrieval of the data from at least one of the display buffer or the default buffer is based on an unsuccessful retrieval of the data from the first cache or a cache miss at the first cache.

Aspect 11 is the apparatus of any of aspects 1 to 10, where to retrieve the data from the first cache, the at least one processor, individually or in any combination, is configured to: read the data directly from the first cache.

Aspect 12 is the apparatus of aspect 11, where the read request is a read with invalidate request associated with the read with invalidate process, wherein to read the data directly from the first cache, the at least one processor, individually or in any combination, is configured to: read the data directly from the first cache; and invalidate the data from the first cache.

Aspect 13 is the apparatus of any of aspects 1 to 12, where to retrieve the data from the at least one second memory, the at least one processor, individually or in any combination, is configured to: transmit, to the at least one second memory, a request for the data; and receive the data from the at least one second memory based on the request.

Aspect 14 is the apparatus of any of aspects 1 to 13, where the memory address is located at the first cache, and wherein to write the data associated with the data processing, the at least one processor, individually or in any combination, is configured to: store, in the memory address at the first cache, the data associated with the data processing.

Aspect 15 is the apparatus of any of aspects 1 to 14, where the first cache is a system cache or a shared cache, and wherein the at least one second memory is a dynamic random access memory (DRAM) or a next level cache.

Aspect 16 is the apparatus of aspect 15, where the shared cache is shared between a first device and a second device, wherein the first device is a producer device, a first controller, a first processor, a graphics processor, or a graphics processing unit (GPU), and wherein the second device is a consumer device, a second controller, a second processor, a display processor, or a display processing unit (DPU).

Aspect 17 is the apparatus of any of aspects 1 to 16, where to retrieve the data from the first cache, the at least one processor, individually or in any combination, is configured to: retrieve the data from the first cache based on the timing of the indication of the data write being less than or equal to a timing threshold; and where to retrieve the data from the at least one second memory, the at least one processor, individually or in any combination, is configured to: retrieve the data from the at least one second memory based on the timing of the indication of the data write being greater than the timing threshold.

Aspect 18 is the apparatus of any of aspects 1 to 17, where the data write for the data is associated with a reprojection process for the data processing.

Aspect 19 is the apparatus of aspect 18, where to obtain the indication of the data write, the at least one processor, individually or in any combination, is configured to: obtain the indication of the data write from reprojection hardware at a graphics processing unit (GPU), and where the reprojection hardware is associated with the reprojection process for the data processing.

Aspect 20 is the apparatus of any of aspects 1 to 19, where the data associated with the data processing is at least one of: pixel data, sub-pixel data, texture pixel (texel) data, or color data.

Aspect 21 is the apparatus of any of aspects 1 to 20, where to output the retrieved data, the at least one processor, individually or in any combination, is configured to: transmit the retrieved data to at least one of: a consumer device, a controller, a processor, a display processor, or a display processing unit (DPU).

Aspect 22 is the apparatus of any of aspects 1 to 21, where to output the retrieved data, the at least one processor, individually or in any combination, is configured to: store the retrieved data in at least one other cache or at least one other memory.

Aspect 23 is the apparatus of any of aspects 1 to 22, where to receive the read request for the data, the at least one processor, individually or in any combination, is configured to: receive the read request from at least one of: a consumer device, a controller, a processor, a display processor, or a display processing unit (DPU).

Aspect 24 is the apparatus of any of aspects 1 to 23, further including (i.e., comprising): at least one of an antenna or a transceiver coupled to the at least one processor, and where to obtain the indication of the data write for the data associated with the data processing, the at least one processor, individually or in any combination, is configured to: obtain, via at least one of the antenna or the transceiver, the indication of the data write for the data associated with the data processing.

Aspect 25 is a method of data processing for implementing any of aspects 1 to 24.

Aspect 26 is an apparatus for data processing including means for implementing any of aspects 1 to 24.

Aspect 27 is a computer-readable medium (e.g., a non-transitory computer-readable medium) storing computer executable code (e.g., code for data processing), the code when executed by at least one processor causes the at least one processor to implement any of aspects 1 to 24.

What is claimed is:

1. An apparatus for data processing, comprising:
at least one memory; and
at least one processor coupled to the at least one memory and, based at least in part on information stored in the at least one memory, the at least one processor, individually or in any combination, is configured to:
obtain an indication of a data write for data associated with the data processing;
write, based on the indication, the data associated with the data processing to a memory address;
receive a read request for the data including the memory address, wherein the read request is associated with a read with invalidate process;
retrieve, based on the read request, the data from at least one of a first cache or at least one second memory, wherein the retrieval of the data is based on a timing of the indication of the data write;
output the retrieved data from at least one of the first cache or the at least one second memory; and
detect whether the timing of the indication of the data write is greater than a timing threshold, wherein the retrieval of the data is based on the detection.

2. The apparatus of claim 1, wherein the timing of the indication of the data write is less than or equal to the timing threshold, and wherein to retrieve the data, the at least one processor, individually or in any combination, is configured to: retrieve the data from the first cache.

3. The apparatus of claim 2, wherein the timing of the indication being less than or equal to the timing threshold is associated with a suitable timeline for the data processing.

4. The apparatus of claim 1, wherein the timing of the indication of the data write is greater than the timing threshold, and wherein to retrieve the data, the at least one processor, individually or in any combination, is configured to: retrieve the data from the at least one second memory.

5. The apparatus of claim 4, wherein the timing of the indication being greater than the timing threshold is associated with an unsuitable timeline or a timeline error for the data processing.

6. The apparatus of claim 1, wherein the at least one second memory includes at least one of a display buffer or a default buffer, and wherein to retrieve the data from the at least one second memory, the at least one processor, individually or in any combination, is configured to: retrieve the data from at least one of the display buffer or the default buffer.

7. The apparatus of claim 6, wherein the at least one processor, individually or in any combination, is further configured to:
configure the at least one second memory with at least one of the display buffer or the default buffer, wherein to retrieve the data, the at least one processor, individually or in any combination, is configured to: retrieve the data from at least one of the configured display buffer or the configured default buffer.

8. The apparatus of claim 6, wherein the at least one second memory is preconfigured with at least one of the display buffer or the default buffer, wherein to retrieve the data, the at least one processor, individually or in any combination, is configured to: retrieve the data from at least one of the preconfigured display buffer or the preconfigured default buffer.

9. The apparatus of claim 6, wherein the retrieval of the data from at least one of the display buffer or the default buffer is based on an unsuccessful retrieval of the data from the first cache or a cache miss at the first cache.

10. The apparatus of claim 1, wherein to retrieve the data from the first cache, the at least one processor, individually or in any combination, is configured to: read the data directly from the first cache.

11. The apparatus of claim 10, wherein the read request is a read with invalidate request associated with the read with invalidate process, wherein to read the data directly from the first cache, the at least one processor, individually or in any combination, is configured to:
read the data directly from the first cache; and
invalidate the data from the first cache.

12. The apparatus of claim 1, wherein to retrieve the data from the at least one second memory, the at least one processor, individually or in any combination, is configured to:
transmit, to the at least one second memory, a request for the data; and
receive the data from the at least one second memory based on the request.

13. The apparatus of claim 1, wherein the memory address is located at the first cache, and wherein to write the data associated with the data processing, the at least one processor, individually or in any combination, is configured to:

store, in the memory address at the first cache, the data associated with the data processing.

14. The apparatus of claim 1, wherein the first cache is a system cache or a shared cache, and wherein the at least one second memory is a dynamic random access memory (DRAM) or a next level cache.

15. The apparatus of claim 14, wherein the shared cache is shared between a first device and a second device, wherein the first device is a producer device, a first controller, a first processor, a graphics processor, or a graphics processing unit (GPU), and wherein the second device is a consumer device, a second controller, a second processor, a display processor, or a display processing unit (DPU).

16. The apparatus of claim 1, wherein to retrieve the data from the first cache, the at least one processor, individually or in any combination, is configured to: retrieve the data from the first cache based on the timing of the indication of the data write being less than or equal to a timing threshold; and wherein to retrieve the data from the at least one second memory, the at least one processor, individually or in any combination, is configured to: retrieve the data from the at least one second memory based on the timing of the indication of the data write being greater than the timing threshold.

17. The apparatus of claim 1, wherein the data write for the data is associated with a reprojection process for the data processing, and wherein to obtain the indication of the data write, the at least one processor, individually or in any combination, is configured to: obtain the indication of the data write from reprojection hardware at a graphics processing unit (GPU), and wherein the reprojection hardware is associated with the reprojection process for the data processing.

18. The apparatus of claim 1, wherein the data associated with the data processing is at least one of: pixel data, sub-pixel data, texture pixel (texel) data, or color data.

19. The apparatus of claim 1, wherein to output the retrieved data, the at least one processor, individually or in any combination, is configured to: transmit the retrieved data to at least one of: a consumer device, a controller, a processor, a display processor, or a display processing unit (DPU).

20. The apparatus of claim 1, wherein to output the retrieved data, the at least one processor, individually or in any combination, is configured to: store the retrieved data in at least one other cache or at least one other memory.

21. The apparatus of claim 1, wherein to receive the read request for the data, the at least one processor, individually or in any combination, is configured to: receive the read request from at least one of: a consumer device, a controller, a processor, a display processor, or a display processing unit (DPU).

22. The apparatus of claim 1, further comprising at least one of an antenna or a transceiver coupled to the at least one processor, wherein to obtain the indication of the data write for the data associated with the data processing, the at least one processor, individually or in any combination, is configured to: obtain, via at least one of the antenna or the transceiver, the indication of the data write for the data associated with the data processing.

23. A method of data processing, comprising:
obtaining an indication of a data write for data associated with the data processing;
writing, based on the indication, the data associated with the data processing to a memory address;
receiving a read request for the data including the memory address, wherein the read request is associated with a read with invalidate process;
retrieving, based on the read request, the data from at least one of a first cache or at least one second memory, wherein the retrieval of the data is based on a timing of the indication of the data write;
outputting the retrieved data from at least one of the first cache or the at least one second memory; and
detecting whether the timing of the indication of the data write is greater than a timing threshold, wherein the retrieval of the data is based on the detection;
wherein the timing of the indication of the data write is less than or equal to the timing threshold, and wherein retrieving the data comprises: retrieving the data from the first cache, wherein the timing of the indication being less than or equal to the timing threshold is associated with a suitable timeline for the data processing; or
wherein the timing of the indication of the data write is greater than the timing threshold, and wherein retrieving the data comprises: retrieving the data from the at least one second memory, wherein the timing of the indication being greater than the timing threshold is associated with an unsuitable timeline or a timeline error for the data processing.

24. The method of claim 23, wherein the at least one second memory includes at least one of a display buffer or a default buffer, and wherein retrieving the data from the at least one second memory comprises: retrieving the data from at least one of the display buffer or the default buffer, further comprising:
configuring the at least one second memory with at least one of the display buffer or the default buffer, wherein retrieving the data comprises: retrieving the data from at least one of the configured display buffer or the configured default buffer.

25. The method of claim 23, wherein retrieving the data from the at least one second memory comprises:
transmitting, to the at least one second memory, a request for the data; and
receiving the data from the at least one second memory based on the request.

26. The method of claim 23, wherein retrieving the data from the first cache comprises: retrieving the data from the first cache based on the timing of the indication of the data write being less than or equal to a timing threshold; and
wherein retrieving the data from the at least one second memory comprises: retrieving the data from the at least one second memory based on the timing of the indication of the data write being greater than the timing threshold.

* * * * *